(12) United States Patent
Tsubata et al.

(10) Patent No.: US 8,168,980 B2
(45) Date of Patent: *May 1, 2012

(54) ACTIVE MATRIX SUBSTRATE, DISPLAY DEVICE, TELEVISION RECEIVER, MANUFACTURING METHOD OF ACTIVE MATRIX SUBSTRATE, FORMING METHOD OF GATE INSULATING FILM

(75) Inventors: Toshihide Tsubata, Tsu (JP); Masanori Takeuchi, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 769 days.

This patent is subject to a terminal disclaimer.

(21) Appl. No.: 12/162,042

(22) PCT Filed: Nov. 7, 2006

(86) PCT No.: PCT/JP2006/322151
§ 371 (c)(1),
(2), (4) Date: Jul. 24, 2008

(87) PCT Pub. No.: WO2007/097074
PCT Pub. Date: Aug. 30, 2007

(65) Prior Publication Data
US 2009/0057682 A1 Mar. 5, 2009

(30) Foreign Application Priority Data
Feb. 24, 2006 (JP) .................. 2006-049363

(51) Int. Cl.
*H01L 29/15* (2006.01)
(52) U.S. Cl. ...... 257/72; 257/59; 257/401; 257/E29.291
(58) Field of Classification Search .............. 257/59–60, 257/72, E29.291, 208, 365, 401
See application file for complete search history.

(56) References Cited

U.S. PATENT DOCUMENTS
5,380,555 A 1/1995 Mine et al.
(Continued)

FOREIGN PATENT DOCUMENTS
EP 1 788 425 5/2007
(Continued)

OTHER PUBLICATIONS
International Search Report for PCT/JP2006/322151 mailed Feb. 13, 2007.
(Continued)

*Primary Examiner* — Kenneth Parker
*Assistant Examiner* — Jose R Diaz
(74) *Attorney, Agent, or Firm* — Nixon & Vanderhye P.C.

(57) ABSTRACT

In an active matrix substrate of the present invention, a gate insulating film for covering a gate electrode of each transistor has a thin portion, having a reduced film thickness, which is provided on a part overlapped on the gate electrode, and the thin portion is formed by using the gate electrode, on which the thin portion is overlapped, as a mask, and each transistor has a first drain electrode section and a second drain electrode section which are respectively provided on both sides of a source electrode, and the thin portion has two edges opposite to each other, and the first drain electrode section is overlapped on the one edge, and the second drain electrode section is overlapped on the other edge. This makes it possible to provide an active matrix substrate which realizes high display quality while suppressing unevenness of parasitic capacitances (particularly, Cgd) of TFTs in the active matrix substrate whose each TFT has a thin portion in its gate insulating film.

20 Claims, 19 Drawing Sheets

U.S. PATENT DOCUMENTS

| | | | |
|---|---|---|---|
| 5,721,164 A * | 2/1998 | Wu | 438/159 |
| 5,767,929 A | 6/1998 | Yachi et al. | |
| 5,953,084 A | 9/1999 | Shimada et al. | |
| 6,052,162 A | 4/2000 | Shimada et al. | |
| 6,097,452 A | 8/2000 | Shimada et al. | |
| 6,195,138 B1 | 2/2001 | Shimada et al. | |
| 6,265,249 B1 * | 7/2001 | Wu | 438/158 |
| 6,566,685 B2 * | 5/2003 | Morikawa et al. | 257/59 |
| 7,868,960 B2 * | 1/2011 | Tsubata et al. | 349/43 |
| 2001/0002857 A1 | 6/2001 | Shimada et al. | |
| 2007/0051952 A1 | 3/2007 | Yamazaki et al. | |

FOREIGN PATENT DOCUMENTS

| | | |
|---|---|---|
| JP | 61-225869 | 10/1986 |
| JP | 01-234831 | 9/1989 |
| JP | 01-300567 | 12/1989 |
| JP | 03-050526 | 3/1991 |
| JP | 03-051819 | 3/1991 |
| JP | 05-203986 | 8/1993 |
| JP | 06-112485 | 4/1994 |
| JP | 07-028087 | 1/1995 |
| JP | 07-114044 | 5/1995 |
| JP | 08-328038 | 12/1996 |
| JP | 09-179141 | 7/1997 |
| JP | 10-102003 | 4/1998 |
| JP | 11-015024 | 1/1999 |
| JP | 11-119253 | 4/1999 |
| JP | 2001-098224 | 4/2001 |
| JP | 2005-038895 | 2/2005 |
| JP | 2005-159331 | 6/2005 |
| JP | 2005-223254 | 8/2005 |
| JP | 2005-228805 | 8/2005 |
| WO | 2005/041311 A1 | 5/2005 |

OTHER PUBLICATIONS

D.K. Choi et al., "Performance of TFT passivated with low-K dielectrics" (2003) pp. 617-620.

PCT International Preliminary Report issued Aug. 26, 2008; Written Opinion mailed Dec. 5, 2006 for PCT/JP2006/321118.

Notice of Allowance mailed Oct. 7, 2010 for U.S. Appl. No. 12/097,595, filed Jun. 16, 2008; Tsubata.

* cited by examiner (a)

(b)

(c)

(d)

(e)

(f)

(g)

(a)

(b)

(c)

(d)

(e)

ACTIVE MATRIX SUBSTRATE, DISPLAY DEVICE, TELEVISION RECEIVER, MANUFACTURING METHOD OF ACTIVE MATRIX SUBSTRATE, FORMING METHOD OF GATE INSULATING FILM

This application is the U.S. national phase of International Application No. PCT/JP2006/322151, filed Nov. 7, 2006 which designated the U.S. and claims priority to Japanese Application No. 2006-049363, filed 24 Feb. 2006, the entire contents of each of which are hereby incorporated by reference.

TECHNICAL FIELD

The present invention relates to an active matrix substrate, a display device, and a manufacturing method of the active matrix substrate. More specifically, the present invention relates to (i) a display device such as a liquid crystal display device, an EL (electro Luminescence) display device, and the like, and (ii) an active matrix substrate used therein, and (iii) a manufacturing method of the active matrix substrate.

BACKGROUND ART

An active matrix substrate is widely used in an active matrix type display device such as a liquid crystal display device, an EL (Electro Luminescence) display device, and the like. In an active matrix substrate used in a conventional active matrix type liquid crystal display device, a switching element such as a TFT (Thin Film Transistor) is provided on each of junctions between a plurality of scanning signal lines and a plurality of data signal lines which are disposed so as to cross each other. Further, a switching function of the TFT or the like allows an image signal to be suitably transmitted to each pixel (electrode) section connected to the TFT or the like. Further, there exists also an active matrix substrate arranged so that a storage capacitor element is provided on each of the pixel sections in order to prevent deterioration of an image signal which deterioration is caused by self-discharge of a liquid crystal layer or an OFF current of the TFT or the like during an OFF period of the TFT or the like and in order to use the active matrix substrate whose path receives various kinds of modulation signals in driving liquid crystal.

As an arrangement of an active matrix substrate used in a conventional active matrix type liquid crystal display device, the following substrate is known for example (see Patent Document 1 for example).

The following describes an active matrix substrate provided on a conventional active matrix type liquid crystal display device. FIG. 22 is a plan view illustrating a pixel of a conventional active matrix substrate.

In each pixel region 200 of the conventional active matrix substrate, a plurality of pixel electrodes 51 are provided in a matrix manner, and scanning signal lines 52 each of which supplies a scanning signal and data signal lines 53 each of which supplies a data signal are provided around each of the pixel electrodes 51 so that the scanning signal lines 52 and the data signal lines 53 cross each other. FIG. 22 illustrates one of the plurality of pixel electrodes 51.

Further, at a junction between each scanning signal line 52 and each data signal line 53, a TFT 54 serving as a switching element connected to the pixel electrode 51 is provided. The scanning signal line 52 is connected to the gate electrode 55 of the TFT 54. In response to a scanning signal, driving of the TFT 54 is controlled. Further, the data signal line 53 is connected to a source electrode 66a of the TFT 54 so that a data signal is inputted to the electrode 66a. Further, a drain wiring line 56 is connected to a drain electrode 66b of the TFT 54. One electrode (storage-capacitor upper electrode) 57 of the storage capacitor element is connected to the drain wiring 56. Also, the storage-capacitor upper electrode 57 is connected to the pixel electrode 51 via a contact hole 58. Further, a storage capacitor (common) wiring 59 functions as the other electrode (storage-capacitor lower electrode) of the storage capacitor element.

An arrangement of the TFT 54 of the active matrix substrate 200 is described as follows. First, the gate electrode 55 connected to the scanning signal line 52 is provided on a transparent insulating substrate and a gate insulating film is provided so as to cover the gate electrode. Further, a semiconductor layer is provided on the gate insulating film so that the semiconductor layer is overlapped on the gate electrode. The source electrode 66a and the drain electrode 66b are provided so as to partially cover the semiconductor layer.

However, the gate insulating layer arranged so as to have a single-layer structure in this manner raises the following problem. If a defect such as a pinhole, a crack, and the like of the gate insulating film occurs at the junction between the scanning signal line and the data signal line, each signal line is short-circuited. Thus, an arrangement in which the gate insulating film has a two-layer structure is proposed (see Patent Document 2).

However, the gate insulating film arranged so as to have a two-layer structure raises the following problem. Existence of a thick gate insulating film between the gate electrode and the semiconductor layer causes deterioration of a property of the TFT.

As a technique for avoiding the problem, Patent Document 3 discloses an arrangement in which: the gate insulating layer has a single-layer structure (silicon nitride film) in its portion corresponding to a lower portion of the semiconductor layer and has a plural-layer structure (silicon oxide film and silicon nitride film) in its other portion. In this technique, it is necessary to carry out etching or the like so as to remove the silicon oxide film corresponding to the lower portion of the semiconductor layer by a photolithography step and a dry-etching step.

[Patent Document 1]
Japanese Unexamined Patent Publication Tokukaihei 9-152625 (Publication date: Jun. 10, 1997)
[Patent Document 2]
Japanese Unexamined Patent Publication Tokukaihei 7-114044 (Publication date: May 2, 1995)
[Patent Document 3]
Japanese Unexamined Patent Publication Tokukaihei 6-112485 (Publication date: Apr. 22, 1994)

DISCLOSURE OF INVENTION

However, particularly in a large active matrix substrate, an exposure process at the photolithography step is carried out plural times. This is because it is impossible to carry out the exposure process with respect to the entire large substrate at once. In this case, the arrangement raises such problem that: an exposure pattern deviates in the respective exposure processes, so that a positional relation between the gate electrode and a single-layer portion of the gate insulating film deviates (alignment deviates). If the positional relation therebetween deviates, this causes unevenness of parasitic capacitances (Cgd) each of which occurs between the gate electrode and the drain electrode in the substrate. This results in unevenness of drain pull-in voltages which occur in turning OFF the gates for example, so that display quality deteriorates.

The present invention was made in view of the foregoing problems, and an object of the present invention is to provide an active matrix substrate, in which a gate insulating film of each TFT has a thin portion, wherein unevenness of parasitic capacitances (particularly, Cgd) of TFTs in the substrate is suppressed so as to realize high-quality display.

In order to solve the foregoing problems, an active matrix substrate according to the present invention includes a plurality of transistors, wherein a gate insulating film which covers a gate electrode of each of the transistors has a thin portion, having a reduced film thickness, which is provided on a part overlapped on the gate electrode, and the thin portion is formed by using the gate electrode, on which the gate insulating film is overlapped, as a mask.

The gate insulating film is formed so as to have a thinner portion positioned over the gate electrode (and other portion positioned over the substrate is thicker than the aforementioned portion), so that it is possible to suppress occurrence of wiring short circuit while keeping the transistor property.

According to the arrangement, each thin portion is formed by using the gate electrode on which the thin portion is overlapped. For example, in the photolithography step for forming each thin portion, the gate electrode is used as a mask. This allows the thin portion to be aligned with the gate electrode, thereby avoiding unevenness in a positional relation between the gate electrode and the thin portion in the substrate. This makes it possible to suppress unevenness of parasitic capacitances (particularly, Cgd) of TFTs in the substrate. As a result, it is possible to improve display quality of a display device using the present active matrix substrate.

It is preferable to arrange the present active matrix substrate so that the transistor has (i) a source electrode and (ii) a first drain electrode and a second drain electrode which are respectively provided on both sides of the source electrode, and the thin portion has a shape whose two edges are opposite to each other and the first drain electrode is overlapped on the one edge (bridges the one edge) and the second drain electrode is overlapped on the other edge (bridges the other edge).

In the arrangement, each of a part between the source electrode and the drain electrode section and a part between the source electrode and the second drain electrode section serves as a channel region.

Herein, the first drain electrode section is overlapped on the one edge of the thin portion, and the second drain electrode section is overlapped on the other edge of the thin portion, so that the two drain electrode sections compensate each other for a superposing area in response to positional deviation (particularly, deviation in a direction in which the edges are opposite to each other) of the drain electrode. For example, in case where deviation of the drain electrode causes the first drain electrode section to be less overlapped on the thin portion, the second drain electrode section is more overlapped on the thin portion, so that a superposing area (total) of the drain electrode sections and the thin portion hardly varies.

In this manner, positional deviation between the gate electrode and the thin portion does not occur and deviation of the drain electrode hardly causes the superposing area of the drain electrodes and the thin portion to vary, so that it is possible to so effectively suppress unevenness of Cgd in the substrate. As a result, it is possible to improve display quality of a display device using the present active matrix substrate.

In order to solve the foregoing problems, an active matrix substrate according to the present invention includes a gate insulating film which covers a gate electrode of each of the transistors has a thin portion, having a reduced film thickness, which is provided on a part overlapped on the gate electrode, and the transistor has (i) a source electrode and (ii) a first drain electrode and a second drain electrode which are respectively provided on both sides of the source electrode, and the thin portion has a shape whose two edges are opposite to each other and the first drain electrode is overlapped on the one edge and the second drain electrode is overlapped on the other edge.

In the arrangement, each of a part between the source electrode and the drain electrode section and a part between the source electrode and the second drain electrode section serves as a channel region.

Herein, the first drain electrode section is overlapped on the one edge of the thin portion and the second drain electrode section is overlapped on the other edge of the thin portion, so that the two drain electrode sections compensate each other for a superposing area in response to positional deviation of the drain electrodes (particularly, deviation in a direction in which the edges are positioned opposite to each other). For example, in case where deviation of the drain electrode causes the first drain electrode to be less superimposed on the thin portion, the second drain electrode section is more overlapped on the thin portion, so that a superposing area (total) between the drain electrode sections and the thin portion hardly varies. This makes it possible to improve display quality in a display device using the present active matrix substrate.

It is preferable to arrange the present active matrix substrate so that the first drain electrode and the second drain electrode are positioned in an axisymmetrical manner. This makes it possible to more accurately carry out compensation of the superposing area in response to positional deviation of the drain electrodes. In this case, it is possible to realize such arrangement that the source electrode section extends in the axis of symmetry between the first and second drain electrode sections.

The present active matrix substrate can be arranged so that the gate electrode has a shape whose two edges are opposite to each other and the edges of the thin portion are respectively positioned on the edges of the gate electrode. Further, the present active matrix substrate can be arranged so that the gate electrode has a shape whose two edges are opposite to each other, and the edges of the thin portion are respectively positioned on lines which are more internally positioned away from and along the edges of the gate electrode substantially at equal distances. The thin portion is aligned with the gate electrode in this manner, so that it is possible to avoid unevenness in a positional relation between the gate electrode and the thin portion in the substrate.

The present active matrix substrate can be arranged so that the source electrode has a first source electrode section and a second source electrode section which are opposite to each other, and a third drain electrode section is provided between the first source electrode section and the second source electrode section.

The present active matrix substrate can be arranged so that the gate insulating film has a plurality of gate insulating layers, and at least one of the gate insulating layers is made thin in the thin portion. In this case, it is preferable that a gate insulating layer containing an organic matter is included. Examples of the material containing the organic matter include: SOG material, acryl resin material, epoxy resin, polyimide resin, polyurethane resin, polysiloxane resin, and novolak resin. Each of these materials can be applied onto the substrate, so that it is relatively easy to make the film thicker at a micron order. Thus, a distance between a conduction layer or a storage capacitor wiring connected to the scanning signal line and other wiring can be made larger, so that short circuit hardly occurs.

Further, the present active matrix substrate can be arranged so that the gate insulating film has a plurality of gate insulating layers, and one or more of the gate insulating layers correspond to the thin portion, and a larger number of the gate insulating layers correspond to other portion. Further, the present active matrix substrate can be arranged so that a lowest layer of the gate insulating layers is a planarizing film and corresponds to said other portion. The planarizing film is provided, so that the data signal line is less likely to be cut at a junction between the scanning signal line or the storage capacitor wiring and the data signal line. In this case, the planarizing film may be made of Spin On Glass (SOG) material. According to the present arrangement, another gate insulating layer (second gate insulating layer) and a semiconductor layer (high resistance semiconductor layer and low resistance semiconductor layer) can be sequentially formed on and above the planarizing film (first gate insulating layer) by CVD or a similar process, so that the manufacturing steps can be reduced. Further, the planarizing film has a portion which is in contact with a face of the substrate and whose thickness is larger than a thickness of the gate electrode formed on the face of the substrate, so that it is possible to further improve the planarizing effect.

Further, it is preferable to arrange the present active matrix substrate so that a vicinity of each of the edges in the gate insulating film has a forward tapered shape.

The present active matrix substrate can be arranged so that the thin portion has a rectangular shape, and two sides in a longitudinal direction respectively correspond to the edges of the thin portion. Further, the present active matrix substrate can be arranged so that the gate electrode has a rectangular shape, and two sides in a longitudinal direction respectively correspond to the two edges of the gate electrode. Further, the present active matrix substrate can be arranged so that each of the first drain electrode section and the second drain electrode section extends in a direction of the edges of the thin portion (so as to have a rectangular shape for example). Further, the present active matrix substrate can be arranged so that each of the first drain electrode section and the second electrode section has (I) a stretch portion which is stretched in a direction of the edges of the thin portion and (II) a connecting portion which extends from the stretch portion in a direction away from the source electrode, and the stretch portion is positioned above the thin portion and the connecting portion is overlapped on the edge of the thin portion, and a width of the connecting portion in the direction of the edges is smaller than a width of the stretch portion in the direction of the edges. Examples of the arrangement in which the stretch portion and the connecting portion are provided include a T shape and a carpenter's square shape (in a lateral L-shaped manner). In this arrangement, the first and second drain electrode sections are less overlapped on the gate electrode, so that Cgd can be reduced.

The present active matrix substrate includes first transistor and a second transistor which share a source electrode and a gate electrode in each of pixel regions, wherein a first drain electrode section of the first transistor and a second drain electrode section of the second transistor are opposite to each other, and the source electrode is provided between the first electrode section and the second electrode section, and a gate insulating film which covers each gate electrode has a thin portion, having a reduced film thickness, which is provided on a part overlapped on the gate electrode, and the thin portion has a shape whose two edges are opposite to each other and the first drain electrode is overlapped on the one edge and the second drain electrode is overlapped on the other edge.

The present active matrix substrate includes a so-called multi-pixel structure. According to the arrangement, the first drain electrode section is overlapped on the one edge of the thin portion and the second drain electrode section is overlapped on the other edge of the thin portion, so that the two drain electrode sections compensate each other for a superposing area in response to positional deviation of the drain electrodes (particularly, deviation in a direction in which the edges are positioned opposite to each other). For example, in case where deviation of the drain electrode causes the first drain electrode to be less overlapped on the thin portion, the second drain electrode section is more overlapped on the thin portion, so that a superposing area (total) between the drain electrode sections and the thin portion hardly varies. This makes it possible to effectively suppress unevenness of Cgd in the substrate, thereby improving display quality in a display device using the present active matrix substrate. In this case, it is preferable that each thin portion is formed by using the gate electrode on which the gate insulating film is overlapped. According to the arrangement, each thin portion is formed by using the gate electrode on which the gate insulating film is overlapped. For example, in the photolithography step for forming each thin portion, a gate electrode is used as a mask. This allows the thin portion to be aligned with the gate electrode, thereby avoiding unevenness in a positional relation between the gate electrode and the thin portion in the substrate. This makes it possible to more effectively suppress unevenness of parasitic capacitances (particularly, Cgd) of TFTs in the substrate. As a result, it is possible to improve display quality of a multi-pixel driving type display device using the present active matrix substrate.

Further, a display device of the present invention (e.g., a liquid crystal display device) includes the foregoing active matrix substrate.

Further, a television receiver of the present invention includes the foregoing display device and a tuner section for receiving television broadcast.

Further, an active matrix substrate of the present invention includes a plurality of transistors, wherein a gate insulating film which covers each gate electrode has a thin portion, having a reduced film thickness, which is provided on a part overlapped on the gate electrode, and the thin portion is aligned with the gate electrode on which the thin portion is overlapped.

Further, a method of the present invention for manufacturing an active matrix substrate includes: a gate electrode formation step in which a gate electrode is formed on a substrate; a film formation step in which a gate insulating film for covering the gate electrode is formed; an application step in which a negative photoresist is applied onto the gate insulating film; a first exposure step in which exposure is carried out from a side in which the photoresist is applied; a second exposure step in which exposure is carried out from a side of the substrate with the gate electrode used as a mask; a development patterning step in which the photoresist is developed so as to be patterned; and an etching step in which the photoresist having been patterned is used as a mask so as to etch the gate insulating film.

Further, a method of the present invention for forming a gate insulating film so that a thin portion having a reduced film thickness to be smaller than a thickness of its peripheral portion is formed on a gate insulating film of an active matrix substrate so as to be overlapped on a gate electrode, said method comprising the steps of: forming a first gate insulating layer so as to cover the gate electrode on the substrate; applying a photoresist on the first gate insulating layer and carrying out exposure from a side of the substrate with the gate electrode used as a mask; and patterning the photoresist and etching the first gate insulating layer with the photoresist used as a mask. In this case, it may be so arranged that: after etching the first gate insulating layer to the gate electrode, a second gate insulating layer is formed on the exposed gate electrode and the remaining first gate insulating layer. Further, the first gate insulating layer may be made of Spin On Glass (SOG) material.

As described above, the active matrix substrate according to the present invention makes it possible to suppress unevenness of parasitic capacitances (particularly, Cgd) between TFTs in the substrate, and it is possible to improve display quality in a display device using the present active matrix substrate.

BRIEF DESCRIPTION OF DRAWINGS

FIG. 6($b$) is a cross sectional view taken along A3-A4 of FIG. 6($a$).

REFERENCE NUMERALS

Figure 1:
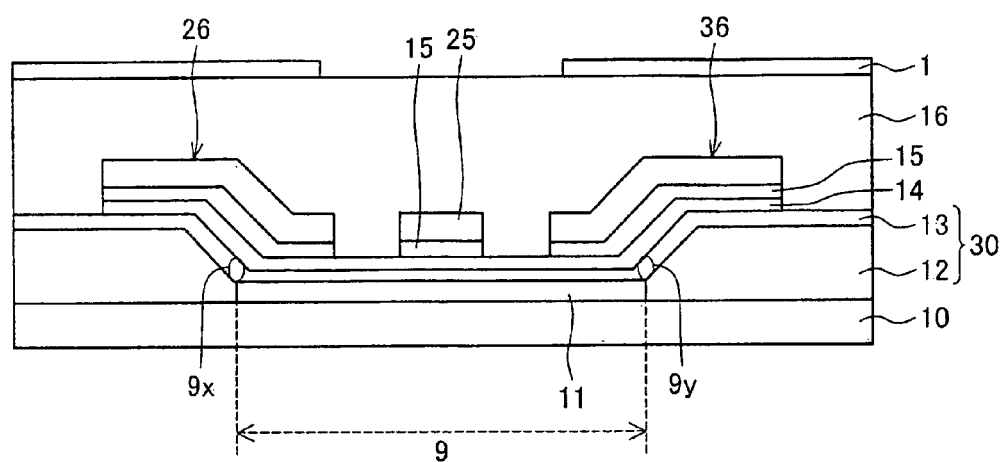
FIG. 1, showing an embodiment of the present invention, is a cross sectional view of a TFT.

1 Pixel electrode
4 TFT (transistor)
6 Drain electrode
9 Thin portion
9$x$-9$y$ Edge of thin portion
10 Transparent insulating substrate
11 Gate electrode
25 Source electrode
26 First drain electrode section
30 Gate insulating film
36 Second drain electrode section
12 First gate insulating layer (planarizing film, SOG film)
13 Second gate insulating layer
100 Pixel region
509 Liquid crystal display device (display device)
601 Television receiver

BEST MODE FOR CARRYING OUT THE INVENTION

The following describes one embodiment of the present invention with reference to FIG. 1 to FIG. 23.

Embodiment 1

Figure 3:
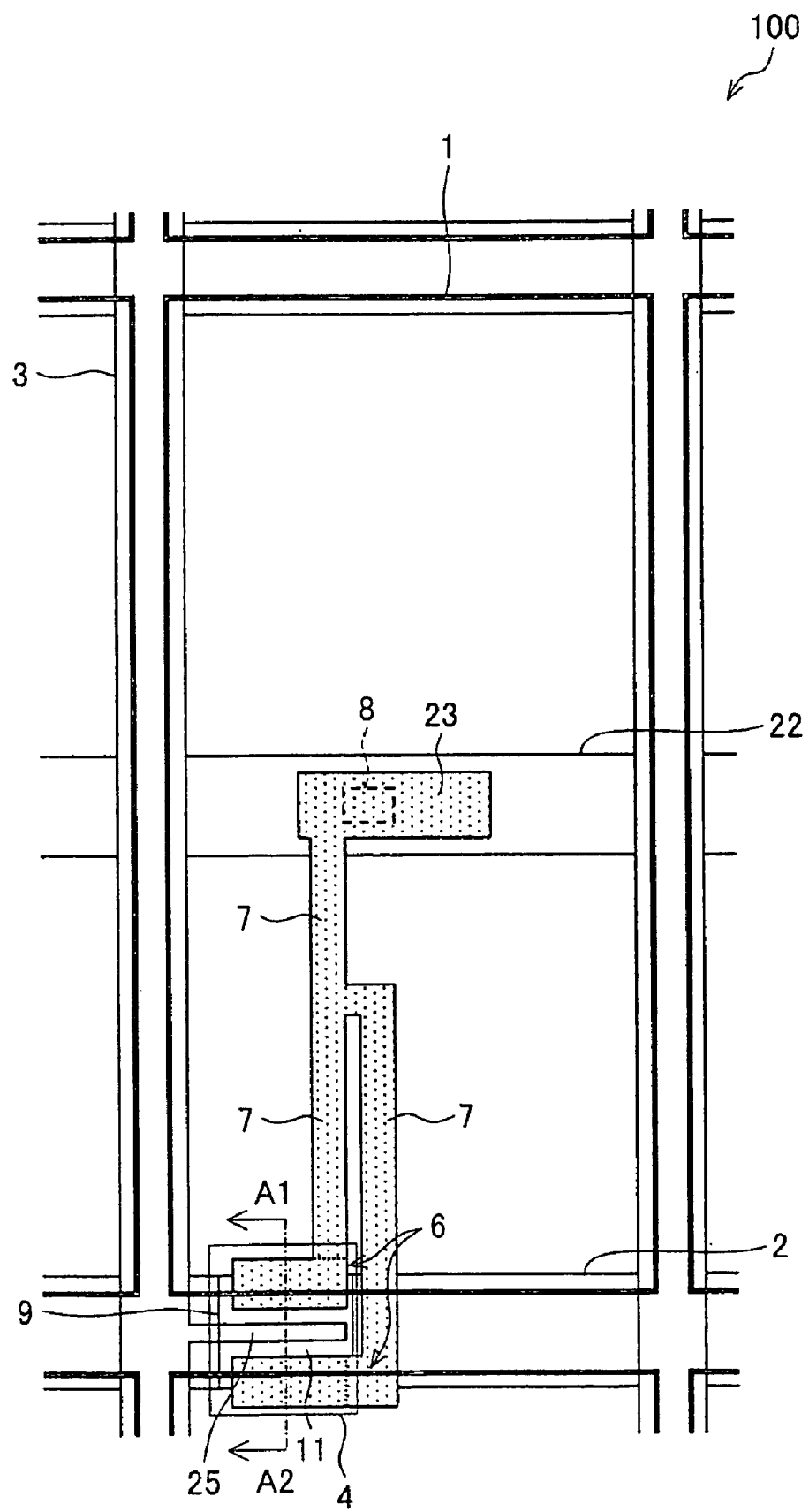
FIG. 3, showing an embodiment of the present invention, is a plan view illustrating an arrangement of a pixel on an active matrix substrate.
Figure 4:
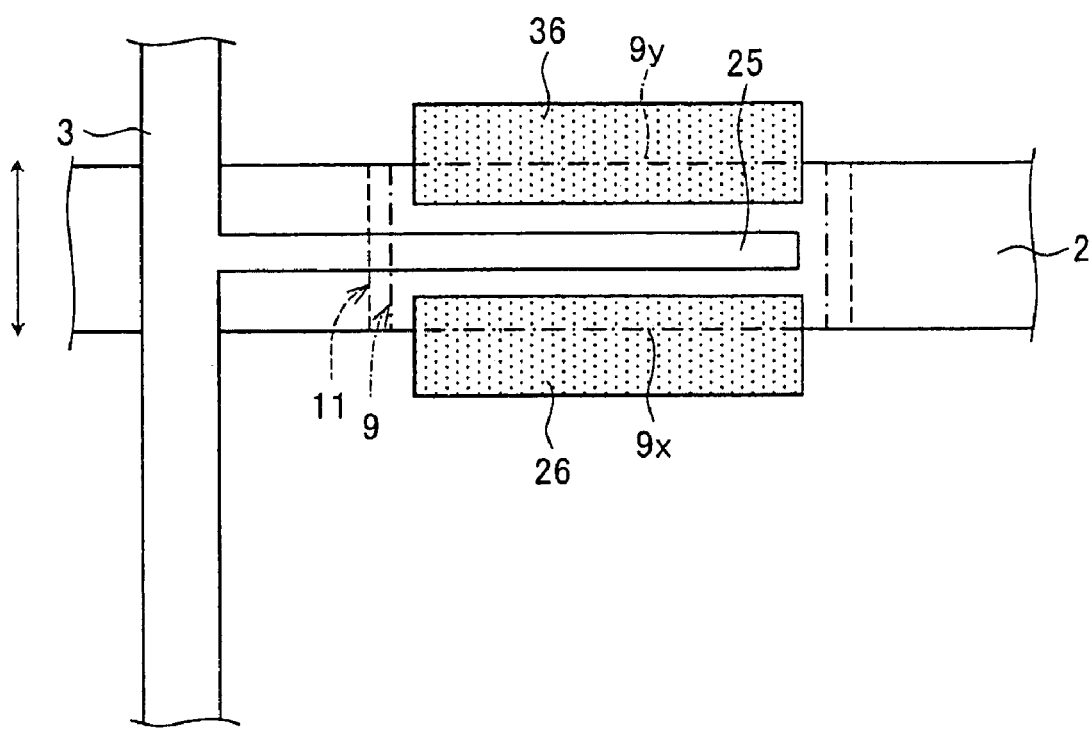
FIG. 4 is an enlarged view illustrating an arrangement of the TFT of FIG. 3.

FIG. 3 is a plan view illustrating an arrangement of a pixel region on an active matrix substrate according to the present embodiment. FIG. 4 is an enlarged view of a TFT section of FIG. 3. As illustrated in FIG. 3 and FIG. 4, a pixel region 100 includes a pixel electrode 1 and a TFT (thin film transistor) 4 thereon. Around the pixel electrode 1, scanning signal lines 2 and data signal lines 3 which cross each other in an orthogonal manner are provided. Further, a storage capacitor wiring 22 is provided so as to cross the pixel electrode 1 in a scanning signal line direction. The TFT 4 is provided in the vicinity of a junction between each scanning signal line 2 and each data signal line 3.

The TFT 4 includes a gate electrode 1, a source electrode 25, and a drain electrode 6. The source electrode 25 is connected to the data signal line 3, and the drain electrode 6 is connected via a drain drawing wiring 7 to a storage-capacitor upper electrode 23 formed on the storage capacitor wiring 22. The storage-capacitor upper electrode 23 is connected to the pixel electrode 1 via a contact hole 8. Note that, the contact hole 8 pierces an interlayer insulating film so as to electrically connect the storage-capacitor upper electrode 23 to the pixel electrode 1. This arrangement allows data (signal voltage) from the data signal line 3 to be applied to the pixel electrode 1 via the source electrode 25 and the drain electrode 6 of the TFT 4.

As illustrated in FIG. 4, the drain electrode 6 includes a first drain electrode 26 and a second drain electrode 36, and the source electrode 25 and the first and second drain electrodes 26 and 36 are formed on the same layer, and each of the source electrode 25 and the first and second drain electrodes 26 and 36 has a longitudinal shape so that the scanning signal line direction is its longitudinal direction. Herein, the first drain electrode 26 is provided on one side of the source electrode 25, and the second drain electrode 36 is provided on the other side of the source electrode 25. More specifically, the first drain electrode 26 and the second drain electrode 36 are disposed in an axisymmetrical manner so that a straight line on the source electrode 25 is an axis of symmetry (butterfly structure).

The gate electrode 11 is a part of the scanning signal line 2 (a part below the TFT4), and two edges of the gate electrode 11 (in the data signal line direction: in a direction indicated by an arrow) which are opposite to each other respectively correspond to two edges of the scanning signal line 2 (in the data signal line direction) which are opposite to each other.

Further, a thin portion 9 (low layer portion) which is thinner than its peripheral portion is formed on the gate electrode 11. The gate insulating film provided on the substrate has a plurality of gate insulating layers, and at least one of the gate insulating layers is partially removed or is partially made thinner, thereby forming the thin portion 9. The thin portion 9 has a rectangular shape so that the scanning signal direction is its longitudinal direction, and the thin portion 9 has two edges 9x and 9y which correspond to two sides in the longitudinal direction and are opposite to each other. The edges 9x and 9y of the thin portion 9 are respectively positioned on the edges of the gate electrode 11. Further, in the gate insulating film, the vicinity of each of the edges 9x and 9y of the thin portion 9 has a forward tapered shape.

Herein, the first drain electrode section 26 is formed so as to be overlapped on the edge 9x of the thin portion 9, and the second drain electrode section 36 is formed so as to be overlapped on the edge 9y of the thin film section 9.

FIG. 1 is a cross sectional view (cross sectional view of the TFT4) taken along A1-A2 of FIG. 3. As illustrated in FIG. 1, the TFT section is arranged so that the gate electrode 11 (scanning signal line 2) and the gate insulating film 30 (first gate insulating layer 12 and the second gate insulating layer 13) are formed on and above the transparent insulating substrate 10 made of glass, plastic, or the like, and a high resistance semiconductor layer 14 and a low resistance semiconductor layer 15 are formed on and above the second gate insulating layer 13 in this order.

Further, the source electrode 25 and the first and second drain electrode sections 26 and 36 are formed on the low resistance semiconductor layer 15 so as to have a butterfly structure (an axisymmetrical structure arranged so that the source electrode 25 is an axis of symmetry). Further, an interlayer insulating film 16 is formed so as to cover upper portions of the TFT4, the scanning signal line 2, the data signal line 3, and the drain drawing wiring 7, and the pixel electrode 1 is formed on the interlayer insulating film 16.

On the substrate and the gate electrode 11, the first gate insulating layer 12 and the second insulating layer 13 are continuously formed as the gate insulating film 30. However, a part of the first gate insulating layer 13 is removed from the gate electrode 11. This portion serves as the thin portion 9. As described above, the edges 9x and 9y of the thin portion 9 are in contact with the edges of the gate electrode 11. An arrangement in which the thin portion 9 is aligned with the gate electrode 11 is obtained by the following process: After forming the first gate insulating layer 12 on the substrate 10, back exposure with the gate electrode 11 used as a mask (exposure below the substrate) is carried out, and a portion of the first gate insulating layer 12 which portion is positioned on the gate electrode 11 is entirely removed (this process will be detailed later). Further, the first drain electrode section 26 is formed so as to bridge the edge 9x of the thin portion 9, and the second drain electrode section 36 is formed so as to bridge the edge 9y of the thin portion 9.

In the present active matrix substrate, the thin portion 9 is formed by using the gate electrode 11 on which the thin portion 11 is overlapped. For example, in the photolithography step for forming the thin portion 9, back exposure with the gate electrode 11 used as a mask is carried out so as to form the thin portion 9 as described above. This allows the thin portion 9 to be aligned with the gate electrode 11, thereby avoiding unevenness in a positional relation between the gate electrode 11 and the thin portion 9 (of the gate insulating film). As a result, it is possible to suppress unevenness of Cgd (parasitic capacitance formed between the gate electrode 11 and each of the drain electrodes 26 and 36) in the substrate. Thus, it is possible to improve display quality of a display device using the present active matrix substrate (e.g., a liquid crystal panel).

Figure 20:
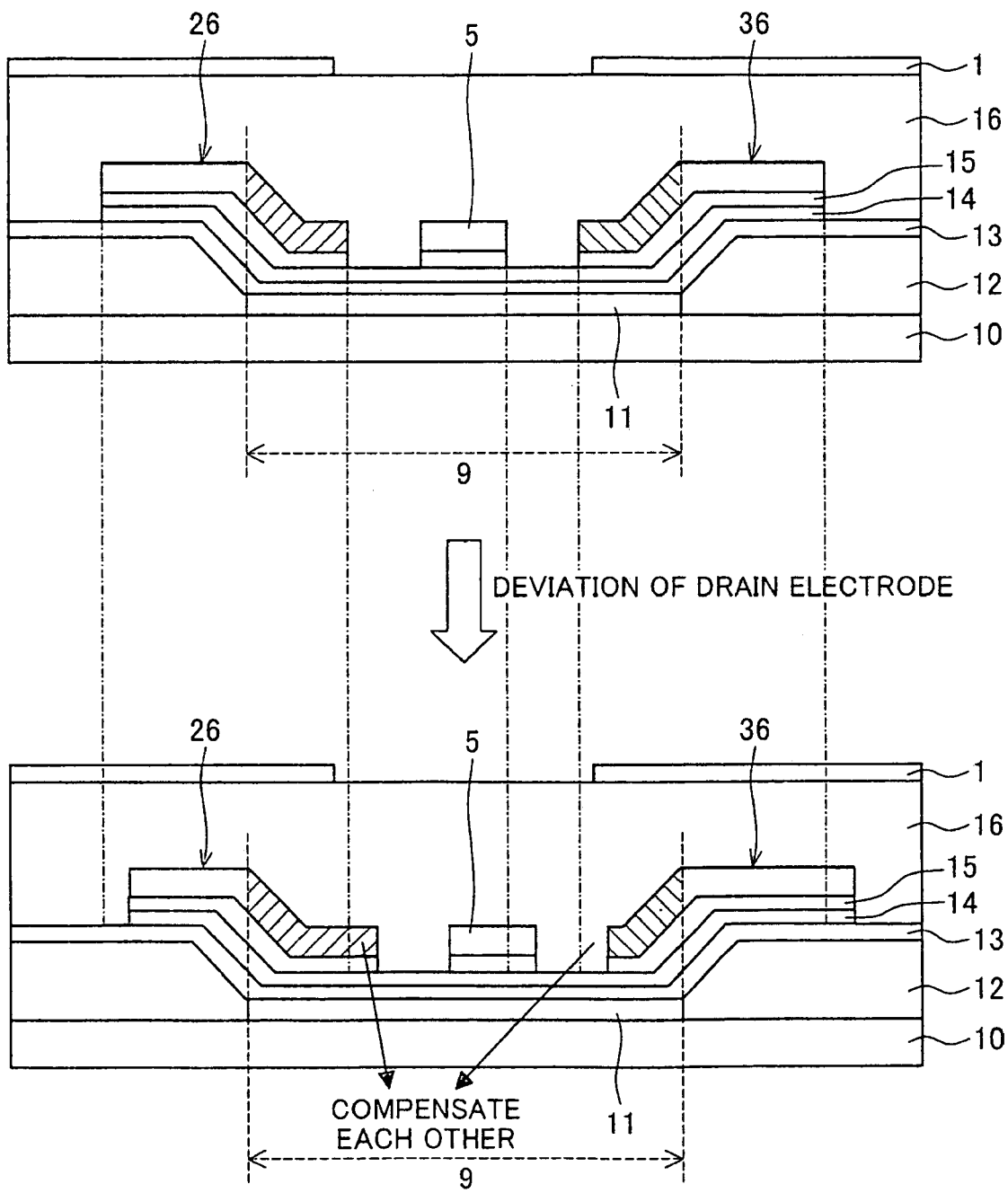
FIG. 20 is a cross sectional view illustrating effect (against drain deviation) of the present embodiment.

Besides, in the present active matrix substrate, the first drain electrode section 26 is overlapped on the edge 9x of the thin portion 9, and the second drain electrode 36 is overlapped on the edge 9y of the thin portion, so that the two drain electrode sections 26 and 36 compensate each other for a superimposing area on the thin portion 9 in response to positional deviation of the drain electrode 6 (particularly, in a channel formation direction: in a direction indicated by an arrow of FIG. 4). For example, as illustrated in FIG. 20, if the drain electrode 6 deviates so that the second drain electrode section 36 is less overlapped on the thin portion 9 (a shaded area decreases), the first drain electrode section 26 is more overlapped on the thin portion 9 (a shaded area increases), which results in no variation in a superposing area (total of the shaded areas) between the drain electrode sections 26 and 36 and the thin portion 9. As a result, it is possible to suppress unevenness in Cgd (parasitic capacitance formed between the gate electrode 11 and each of the drain electrodes 26 and 36) in the substrate. Thus, it is possible to improve display quality of a display device using the present active matrix substrate (e.g., a liquid crystal panel).

In this manner, each of (i) the arrangement in which the thin portion 9 is formed by using the gate electrode 11 (hereinafter, this arrangement is referred to as "feature 1") and (ii) the arrangement in which the first drain electrode section 26 is overlapped on the edge 9x of the thin portion 9 and the second drain electrode section 36 is overlapped on the other edge 9y of the thin portion 9 (hereinafter, this arrangement is referred to as "feature 2") allows for such effect that unevenness of Cgd in the substrate can be suppressed. However, the present active matrix substrate is arranged so that: the features 1 and 2 of the present invention are combined with each other so as to prevent positional deviation between the gate electrode 11 and the thin portion 9 and so as to suppress variation of a superimposing area (total) between both the drain electrodes 26 and 36 and the thin portion 9 even when each of the drain electrodes 26 and 36 deviates with respect to the thin portion 9. This makes it possible to so effectively suppress unevenness of Cgd in the substrate, so that it is possible to greatly improve display quality of a display device using the present active matrix substrate (e.g., a liquid crystal panel).

Note that, the scanning signal line 2 (gate electrode 11) can be arranged as a single-layer film or a laminate film made of metal such as titanium, chromium, aluminum, molybdenum, tantalum, tungsten, cupper, and the like or made of alloy thereof. Further, the thickness of the scanning signal line 2 (gate electrode 11) is about 100 nm to 300 nm (1000 Å to 3000 Å).

In forming the first gate insulating layer 12, an insulative material (material containing an organic matter for example) can be used. Herein, an SOG material is used. The SOG material is a material which allows formation of a glass film (silica membrane) by application such as spin coating. Note that, examples of the material containing organic matter includes not only the SOG material but also acryl resin material, epoxy resin, polyimide resin, polyurethane resin, polysiloxane resin, and novolak resin.

In forming the first gate insulating layer 12, it is preferable to use, out of SOG materials, a Spin On Glass material containing organic component (so-called organic SOG material). As the organic SOG material, it is particularly preferable to use an SOG material having Si—O—C bond as its framework or an SOG material having Si—C bond as its framework. If the organic SOG material is used, it is possible to easily form a thick film whose dielectric constant is low. That is, if the organic SOG material is used, it is possible to lower the dielectric constant of the first gate insulating layer 12 and to make the first gate insulating layer 12 thick and it is possible to planarize the first gate insulating layer 12 (By using the organic SOG material, it is possible to form a thick first gate insulating layer 12 whose dielectric constant is kept low, thereby easily obtaining the planarizing effect). In the present embodiment, the thickness of the first gate insulating layer 12 is about 1.5 μm to 2.0 μm.

Note that, examples of the SOG material having the Si—O—C bond as its framework include: materials disclosed by Japanese Unexamined Patent Publication Tokukai 2001-98224 and by Japanese Unexamined Patent Publication Tokukaihei 6-240455; and DD1100 (product of Dow Corning Toray) disclosed by IDW (Information Display Workshop) '03 proceedings, page 617. Further, an example of the SOG material having the Si—C bond as its framework is a material disclosed by Japanese Unexamined Patent Publication Tokukaihei 10-102003.

Further, an organic SOG material containing silica filler can be used to form the first gate insulating layer 12. In this case, it is preferable that silica filler is dispersed in a base material made of organic SOG material. This arrangement allows the first gate insulating layer 12 to be formed without generating any crack even when the substrate 20 is made larger. Note that, a particle diameter of silica filler is 10 nm to 30 nm for example, and its intermixing ratio is 20 volume % to 80 volume %. As the SOG material containing silica filler, it is possible to use LNT-025 (product of Shokubai Kagaku).

The second gate insulating layer 13 is an insulative film formed on the first gate insulating layer 12. In the present embodiment, the second gate insulating layer 13 is a film made of silicon nitride, and the thickness of the silicon nitride film is about 300 nm to 500 nm (300 Å to 5000 Å).

The high resistance semiconductor layer 14 is formed on the second gate insulating layer 13, and the low resistance semiconductor layer 15 is formed on the high resistance semiconductor layer 14. In forming the high resistance semiconductor layer 14, it is possible to use amorphous silicon, polysilicon, or the like for example. In forming the low resistance semiconductor layer 15, it is possible to use n+ amorphous silicon or the like for example. In the present embodiment, the thickness of the high resistance semiconductor layer 14 is about 100 nm to 300 nm (1000 Å to 3000 Å), and the thickness of the low resistance semiconductor layer 15 is about 40 nm to 70 nm (400 Å to 700 Å).

Further, each of the data signal line 3, the source electrode 25, the drain electrode 6, the drain drawing wiring 7, and the storage-capacitor upper electrode 23 can be arranged as a single-layer film or a laminate film made of metal such as titanium, chromium, aluminum, molybdenum, tantalum, tungsten, cupper, and the like or made of alloy thereof. The thickness thereof is about 100 nm to 300 nm (1000 Å to 3000 Å).

Further, in forming the interlayer insulating film 16, a resin film made of photosensitive acrylic resin or the like, an inorganic insulating film made of silicon nitride, silicon oxide, or the like, or a laminate film or the like which includes these films laminated therein can be used. In the present embodiment, the photosensitive acrylic resin film is used. While, in forming the laminate layer, it is possible to use a laminate film in which a silicon nitride film whose thickness is about 200 nm to 500 nm (2000 Å to 5000 Å) and a photosensitive acrylic resin film whose thickness is 2000 nm to 4000 nm (20000 Å to 40000 Å) are laminated.

Further, the pixel electrode 1 is formed on the interlayer insulating film 16. The pixel electrode 1 is made of a transparent conductive film such as ITO, IZO, zinc oxide, tin oxide, or the like for example, and its thickness is about 100 nm to 200 nm (1000 Å to 2000 Å).

Figure 2:
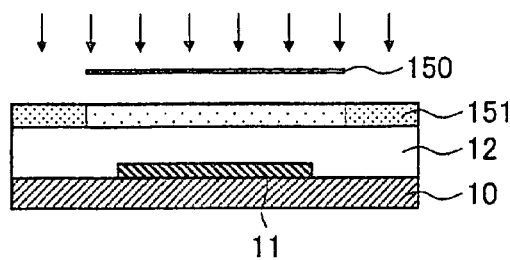
FIG. 2, showing an embodiment of the present invention, is a cross sectional view illustrating steps for manufacturing an active matrix substrate.
Figure 2:
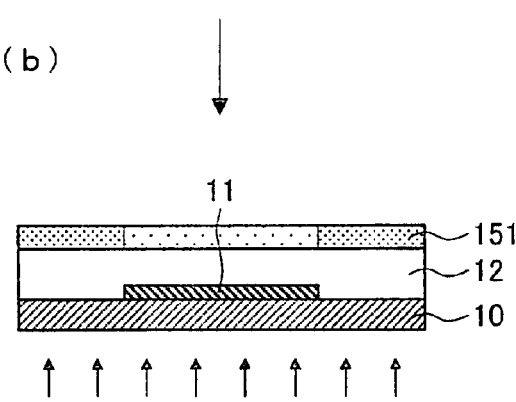
Figure 2:
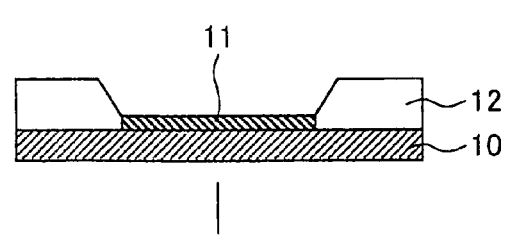
Figure 2:
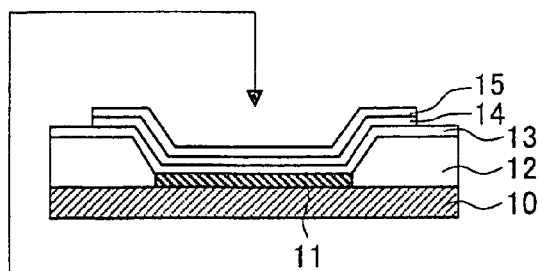
Figure 2:
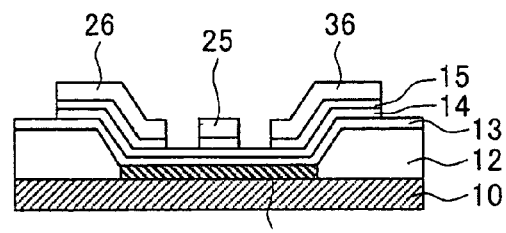
Figure 2:
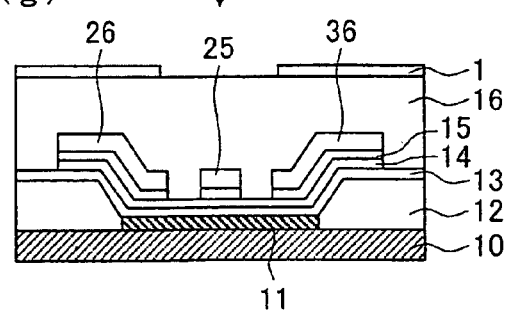

With reference to FIG. 2, the following describes a method for manufacturing the present active matrix substrate.

First, a film made of metal such as titanium, chromium, aluminum, molybdenum, tantalum, tungsten, cupper, and the like or made of alloy thereof is formed on the transparent insulating substrate 10 by sputtering or a similar process. Further, the metal film or the alloy film is patterned by photo etching or a similar process so as to have a necessary shape, thereby forming the gate electrode 11 (scanning signal line) (gate electrode forming step).

Subsequently, an SOG material or the like is applied by spin coating so as to cover the gate electrode 11 (scanning signal line) (insulating film formation step). This allows formation of the first gate insulating layer 12 (planarizing film). Further, a negative photo resist 151 is applied to the first gate insulating layer 12 (application step), and then exposure is carried out by using a first photo mask 150 (first exposure step). As the first photo mask 150, a photo mask larger than the gate electrode 11 (photo mask whose width is larger than the gate electrode 11) is used ((a) of FIG. 2).

Further, exposure is carried out from the side of the transparent insulating substrate 10 (second exposure step). This allows exposure with the gate electrode 11 used as a mask ((b) of FIG. 2). Thereafter, development is carried out ((c) of FIG. 2). This allows the photo resist 151 to be patterned so as to be aligned with the gate electrode 11 (development patterning step). Subsequently, dry etching is carried out so as to be aligned with the gate electrode 111, thereby removing the first gate insulating layer 12 (dry etching step: (d) of FIG. 2). The dry etching is carried out by using mixture gas of hydrogen tetrafluoride ($CF_4$) and oxygen ($O_2$) for example. At this time, by adjusting a mixture ratio of hydrogen tetrafluoride ($CF_4$) and oxygen ($O_2$), it is possible to form the vicinity of the edge, from which the first gate insulating layer has been removed, into a forward tapered shape.

Subsequently, the second gate insulating layer 13, the high resistance semiconductor layer 14, and the low resistance semiconductor layer 15 are sequentially formed by plasma CVD (chemical vapor deposition) or the like, and then these layers are patterned by photo etching or a similar process ((e) of FIG. 2).

In this manner, back exposure is carried out with the gate electrode 11 used as a mask, and the first gate insulating layer 12 is removed so as to be aligned with the gate electrode 11, and the second gate insulating layer 13 is formed thereon (self alignment is carried out), thereby forming the thin portion 9 aligned with the gate electrode 11 as illustrated in FIG. 1 and FIG. 3.

Subsequently, the data signal line 3, the drain drawing wiring 7, the source electrode 25, and the drain electrodes 6 (26 and 36) are formed (see (f) of FIG. 2 and FIG. 3). All these members can be formed by the same step. Specifically, a film made of metal such as titanium, chromium, aluminum, molybdenum, tantalum, tungsten, cupper, and the like or made of alloy thereof is formed by sputtering or a similar process, and the metal film or the alloy film is patterned so as to have a necessary shape, thereby forming each of the foregoing members.

Further, patterns of the source electrode 25 and the drain electrodes 6 (26 and 36) are used as masks, and the high resistance semiconductor layer 14 and the low resistance semiconductor layer 15 are subjected to channel etching (dry etching). This process optimizes the thickness of the high resistance semiconductor layer 14, thereby forming the TFT4 (see FIG. 3). That is, parts of the semiconductor layer 14 which are not covered by the data signal line 3, the source electrode 25, the drain electrodes 6, and the drain drawing electrode 7 are removed by etching, so that a high resistance semiconductor layer thickness required in exhibiting ability of the TFT4 remains. Note that, the semiconductor layers (14 and 15) may be left on portions other than a portion where the TFT4 is formed (for example, around the contact hole 8).

Thereafter, the interlayer insulating film 16 is formed by plasma CVD or spin coating. In case of providing a resin film made of photosensitive acrylic resin or the like, spin coating is adopted. In case of providing a single-layer film consisting of an inorganic insulating film made of silicon nitride, silicon oxide, or the like, plasma CVD is adopted. Further, in case of providing a laminate film in which the resin film and an inorganic insulating film are laminated, for example, a silicon nitride film is formed by plasma CVD, and a photosensitive acrylic resin film is formed on the silicon nitride film by spin coating, thereby forming the laminate film.

Further, the contact hole can be formed by patterning the photosensitive acrylic resin by photolithography (exposure and development). Further, the pixel electrode 1 is formed on the interlayer insulating film 16. The pixel electrode 1 is formed as follows. For example, a transparent conductive film such as ITO, IZO, zinc oxide, tin oxide, or the like is formed by sputtering or a similar process, and the conductive film is subjected to photo etching or a similar process and is patterned so as to have a necessary shape, thereby forming the pixel electrode 1 (FIG. 2(g)).

Figure 5:
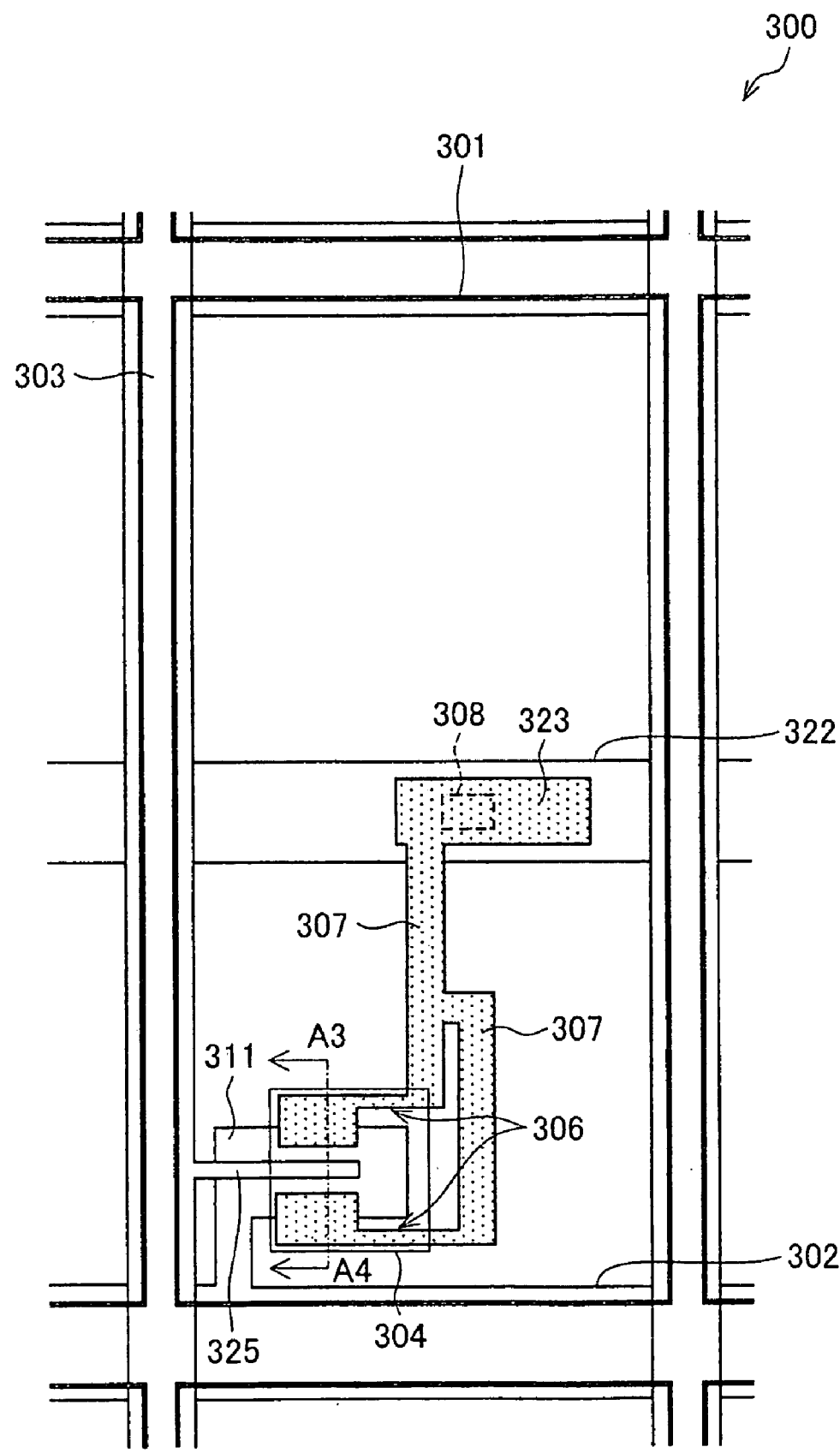
FIG. 5, showing an embodiment of the present invention, is a plan view illustrating an arrangement of a pixel on an active matrix substrate.

The active matrix substrate according to the present invention may be arranged as illustrated in FIG. 5. FIG. 5 is a plan view illustrating an arrangement of a pixel region of the present active matrix substrate. FIG. 6(a) is an enlarged plan view of a TFT section of FIG. 5. As illustrated in FIG. 5 and FIG. 6(a), the pixel region 300 includes a pixel electrode 301 and a TFT304. Around the pixel electrode 301, scanning signal lines 302 and data signal lines 303 which cross each other in an orthogonal manner are provided, and a storage capacitor wiring 322 is provided so as to cross the pixel electrode 301 in a scanning signal line direction. The TFT304 is provided in the vicinity of a junction of each of the scanning signal lines 302 and each of the data signal lines 303.

The TFT304 includes a gate electrode 311, a source electrode 325, and a drain electrode 306. The source electrode 325 is connected to the data signal line 303, and the drain electrode 306 is connected, via a drain drawing wiring 307, to a storage-capacitor upper electrode 323 formed on the storage capacitor wiring 322. The storage-capacitor upper electrode 322 is connected to the pixel electrode 301 via a contact hole 308.

Herein, as illustrated in FIG. 6(a), the drain electrode 306 includes a first drain electrode section 326 and a second drain electrode section 336. Each of the source electrode 325 and the first and second drain electrode sections 326 and 336 has a rectangular shape so that a scanning signal line direction (a horizontal direction in FIG. 6(a)) is its longitudinal direction, and the first and second drain electrode sections 326 and 336 are disposed in a symmetrical manner so that the source electrode 325 is an axis of symmetry (butterfly structure).

The gate electrode 311 has a rectangular shape so that a scanning signal line direction (horizontal direction in FIG. 6(a)) is its longitudinal direction, and the gate electrode 311 is connected to the scanning signal line 302. A gate insulating film (not shown) on the gate electrode 311 has a thin portion 309 which is thinner than the thickness of its periphery. The gate insulating film formed on the substrate includes a plurality of gate insulating layers. At least one of the gate insulating layers is partially removed or is partially made thinner, thereby forming the thin portion 309. The thin portion 309 has a rectangular shape so that a scanning signal line direction is its longitudinal direction, and the thin portion 309 has edges 309x and 309y which respectively correspond to two sides in the longitudinal direction and are opposite to each other. Further, edges 309x and 309y of the thin portion 309 are more internally provided than the two edges 311x and 311y of the gate electrode 311 (in a data signal line direction) which are opposite to each other so that a distance between the edge 311x and the edge 309x and a distance between the edge 311y and the edge 309y are equal to each other and the edges 309x and 309y of the thin portion 309 are respectively in lines along the edges 311x and 311y of the gate electrode 311.

Herein, the first drain electrode section 326 is formed so as to be overlapped on the edge 309x of the thin portion 309, and the second drain electrode section 336 is formed so as to be overlapped on the edge 309y of the thin portion 309.

FIG. 6(b) illustrates a cross sectional view (cross sectional view of the TFT304) taken along A3-A4 of FIG. 6(a). As illustrated in FIG. 5 and FIGS. 6(a) and 6(b), the TFT section is arranged so that: the gate electrode 311 (drawn from the scanning signal line 302) and the gate insulating film 330 (the first gate insulating layer 312 and the second gate insulating layer 313) are formed on and above the transparent insulating substrate 310 made of glass, plastic, or the like, and a high resistance semiconductor layer 314 and a low resistance semiconductor layer 315 are formed on and above the second gate insulating layer 313 in this order. Further, the source electrode 325 and the first and second drain electrode sections 326 and 336 are formed on the low resistance semiconductor layer 315 so as to have a butterfly structure (so that these electrode sections are positioned in an axisymmetrical manner with the source electrode 325 regarded as an axis). Further, an interlayer insulating film 316 is formed so as to cover upper portions of the TFT304, the scanning signal line 302, the data signal line 303, and the drain drawing wiring 307, and the pixel electrode 301 is formed on the interlayer insulating film 316.

On the substrate and the gate electrode 311, the first gate insulating layer 312 and the second gate insulating layer 313 are continuously formed as the gate insulating film 330. On the gate electrode 311, the first gate insulating layer 312 is partially removed. This portion serves as the thin portion 309.

Both the two edges 309x and 309y of the thin portion 309 are positioned between (inside) the two edges 311x and 311y of the gate electrode 311, and a distance between the edge 309x of the thin portion 309 and the edge 311x of the gate electrode 311 is substantially equal to a distance between the edge 309y of the thin portion 309 and the edge 311y of the gate electrode 311. In this manner, the arrangement in which the thin portion 309 is aligned with the gate electrode 311 can be obtained as follows: After forming the first gate electrode insulating layer 312 on the substrate 310, back exposure (exposure below the substrate) is carried out with the gate electrode 311 used as a mask, and a portion of the first gate insulating layer 312 which portion is positioned on the gate electrode 311 is partially removed. Note that, in realizing the foregoing arrangement, for example, light exposure (in FIG. 2(b)) is increased at the time of back exposure carried out from the side of the transparent insulating substrate 10 so as to utilize optical diffraction or a similar phenomenon. Further, the first drain electrode section 326 is formed so as to bridge the edge 309x of the thin portion 309, and the second drain electrode section 336 is formed so as to bridge the edge 309y of the thin portion 309.

In the present active matrix substrate, the thin portion 309 is formed by using the gate electrode 311 on which the thin portion 309 is overlapped. For example, as described above, back exposure with the gate electrode 311 used as a mask is carried out so as to form the thin portion 309 in the lithography step for forming the thin portion 309. This allows the thin portion 309 to be aligned with the gate electrode 311, thereby avoiding unevenness in a positional relation between the gate electrode 311 and the thin portion 309 (of the gate insulating film). As a result, it is possible to suppress unevenness in Cgd (parasitic capacitance formed between the gate electrode 311 and the drain electrodes 326 and 336) in the substrate. Thus, it is possible to improve display quality of a display device using the present active matrix substrate (e.g., a liquid crystal panel).

Besides, in the present active matrix substrate, the first drain electrode section 326 is overlapped on the edge 309x of the thin portion 309, and the second drain electrode 336 is overlapped on the edge 309y of the thin portion, so that the two drain electrode sections 326 and 336 compensate each other for a superposing area on the thin portion 309 in response to positional deviation of the drain electrode 6 (particularly, in a channel formation direction). In the present arrangement, the gate electrode 311 includes both end portions 311x and 311y which are not overlapped on the thin portion 309. If the drain electrode 306 deviates for example, a superposing area (shaded area) between the first drain electrode section 326 and the end portion 311x of the gate electrode 311 does not vary, and also a superposing area (shaded area) between the second drain electrode section 336 and the end portion 311y of the gate electrode 311 does not vary, and the first drain electrode section 326 is less overlapped on the thin portion 309 (a shaded area decreases), and the second drain electrode section 336 is more overlapped on the thin portion 309 (a shaded area increases). This results in no variation in a superposing area (total of the shaded areas) between the drain electrode sections 326 and 336 and the thin portion 309. As a result, it is possible to suppress unevenness in Cgd (parasitic capacitance formed between the gate electrode 311 and each of the drain electrodes 326 and 336) in the substrate. Thus, it is possible to improve display quality of a display device using the present active matrix substrate (e.g., a liquid crystal panel).

In this manner, (i) the arrangement in which the thin portion 309 is formed by using the gate electrode 311 (feature 1) and (ii) the arrangement in which the first drain electrode section 326 is overlapped on the edge 309x of the thin portion 309 and the second drain electrode section 336 is overlapped on the other edge 309y of the thin portion 309 (feature 2) are combined with each other so as to prevent positional deviation between the gate electrode 311 and the thin portion 309 and so as to suppress variation of a superimposing area (total) between both the drain electrodes 326 and 336 and the thin portion 309 even when each of the drain electrodes 326 and 336 deviates with respect to the thin portion 309. This makes it possible to so effectively suppress unevenness of Cgd in the substrate, so that it is possible to greatly improve display quality of a display device using the present active matrix substrate (e.g., a liquid crystal panel).

Figure 12:
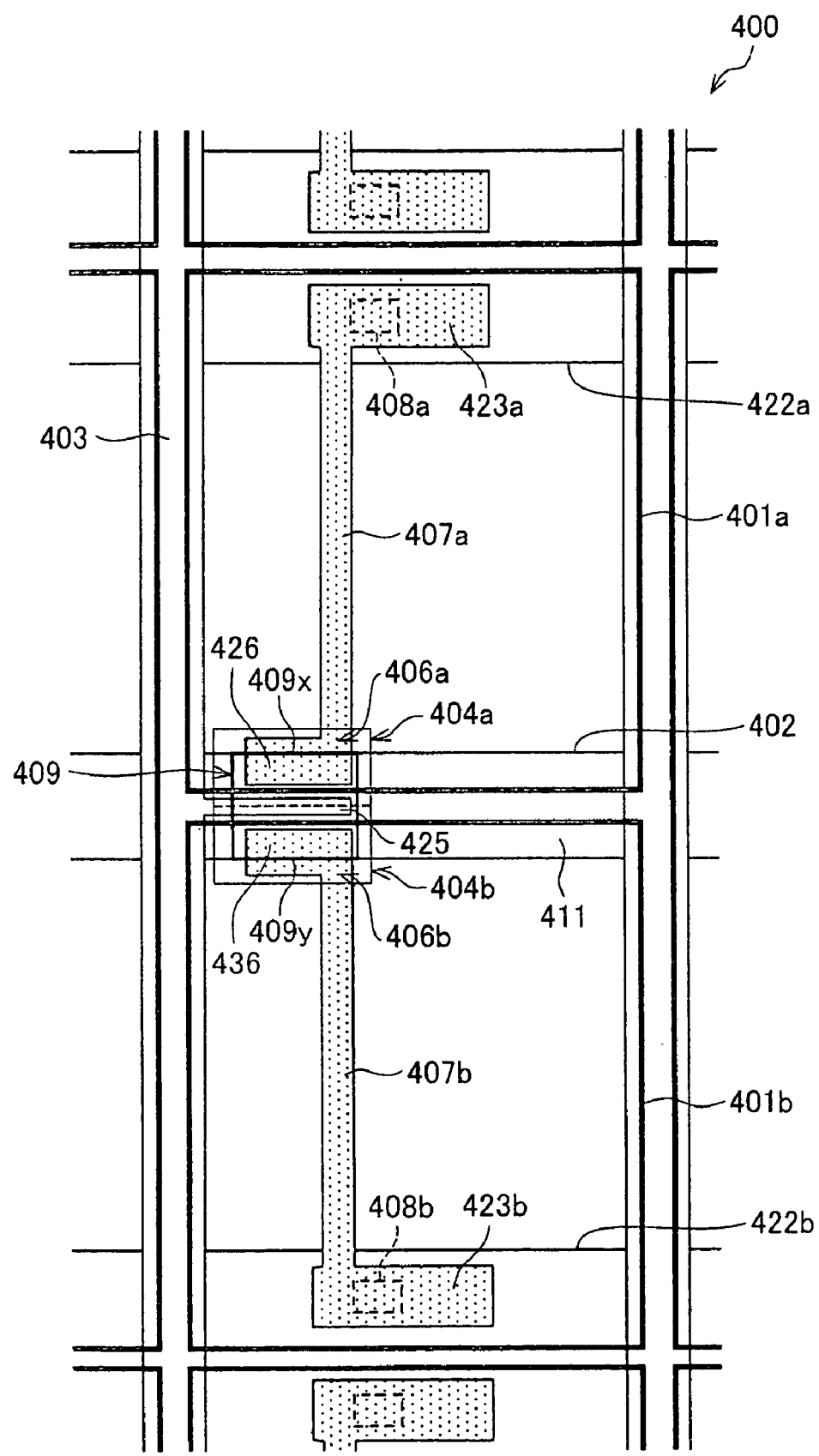
FIG. 12, showing an embodiment of the present invention, is a plan view illustrating a pixel on an active matrix substrate.

The active matrix substrate according to the present invention may be arranged as in FIG. 12. FIG. 12 is a plan view illustrating an arrangement of a pixel region of the present active matrix substrate. As illustrated in FIG. 12, the present active matrix substrate is arranged so that a pixel region 400 includes a first TFT 404a, a second TFT 404b, a first pixel electrode 401a, and a second pixel electrode 401b. Further, a scanning signal line 402 crosses a substantially central portion of the pixel region 400, and a data signal line 403 is provided so as to cross the scanning signal line 402 in an orthogonal manner. On both sides (an upper side and a lower side in FIG. 12) of the scanning signal line 402, the first pixel electrode 401a and the second pixel electrode 401b are respectively provided so as to be positioned adjacent to the data signal line 403 and the scanning signal line 402. Further, a first storage capacitor wiring 422a and a second storage capacitor wiring 422b are provided on the pixel region 400 so as to be respectively positioned on its ends along scanning signal lines so that the first storage capacitor wiring 422a is overlapped on the first pixel electrode 401a and the second storage capacitor wiring 422b is overlapped on the second pixel electrode 401b.

The first TFT 404a and the second TFT 404b are provided in the vicinity of a junction of the scanning signal line 402 and the data signal line 403. The first TFT 404a includes a gate electrode 411, a source electrode 425, and a drain electrode 406. The second TFT 404b includes a gate electrode 411, a source electrode 425, and a drain electrode section 406b. In this manner, the TFT 404a and the TFT 404b share the gate electrode and the source electrode.

The source electrode 425 is connected to the data signal line 403, and the drain electrode 406a is connected, via a drain drawing wiring 407a, to a storage capacitor upper electrode 423a formed on the first storage capacitor wiring 422a. The storage capacitor wiring 423a is connected to the first pixel electrode 401a via a contact hole 408a. Further, the drain electrode section 406b is connected, via a drain drawing wiring 407b, to a storage-capacitor upper electrode 423b formed on the second storage capacitor wiring 422b. The storage-capacitor upper electrode 423b is connected to the second pixel electrode 401b via a contact hole 408b.

According to the arrangement, data (signal potential) from the data signal line 403 is applied to each of the first pixel electrode 401a and the second pixel electrode 401b via (i) a common source electrode 425 shared by the TFT 404a and the TFT 404b and (ii) the drain electrodes 406a and 406b. However, a phase of a signal voltage applied to the first storage capacitor wiring 422a and a phase of a signal voltage applied to the second storage capacitor wiring 422b are opposite to each other, so that potentials of the first pixel electrode 401a and the second pixel electrode 401b are differently controlled. In a liquid crystal panel including an active matrix substrate having the multi-pixel structure (illustrated in FIG. 12), both a bright sub-pixel and a dark sub-pixel can be formed in a single pixel, so that it is possible to express half tone by half tone reproduction, thereby improving excess brightness at an oblique viewing angle of a liquid crystal display screen.

Herein, as illustrated in FIG. 12, the drain electrode 406a includes a first drain electrode section 426 and the drain electrode 406b includes a second drain electrode 436. Further, each of the source electrode 425 and the first and second drain electrodes 426 and 436 has a rectangular shape so that a scanning signal line direction (horizontal direction in FIG. 12) is its longitudinal direction, and the first and second drain electrode sections 426 and 436 are disposed in a symmetrical manner with the source electrode 425 regarded as an axis of symmetry (butterfly structure).

The gate electrode 411 is a part of the scanning signal line 402 (this part corresponds to each of lower portions of the TFT404a and 404b), and two edges of the gate electrode 411 which are opposite to each other (in a data signal line direction: in a direction indicated by an arrow of FIG. 12) correspond to two edges of the scanning signal line 402 which are opposite to each other (in a data signal line direction).

Further, a gate insulating film (not shown) on the gate electrode 411 has a thin portion 409 which is thinner than the thickness of its peripheral portion. The gate insulating film provided on the substrate includes a plurality of gate insulating layers, and at least one of the gate insulating layers is partially removed or is partially made thinner, thereby forming the thin portion 409. The thin portion 409 has a rectangular shape so that a scanning signal direction is its longitudinal direction, and the thin portion 409 has two edges 409x and 409y which respectively correspond to two sides in the longitudinal direction and are opposite to each other. The edges 409x and 409y of the thin portion 409 are respectively positioned on the edges of the gate electrode 411.

Herein, the first drain electrode section 426 is formed so as to be overlapped on the edge 409x of the thin portion 409, and the second drain electrode section 436 is formed so as to be overlapped on the edge 409y of the thin portion 409.

In the present active matrix substrate, the thin portion 409 is formed by using the gate electrode 411 on which the thin portion 409 is overlapped. For example, in the photolithography step for forming the thin portion 409, back exposure with the gate electrode 411 used as a mask is carried out so as to form the thin portion 409 as described above. This allows the thin portion 409 to be aligned with the gate electrode 411, thereby avoiding unevenness in a positional relation between the gate electrode 411 and the thin portion 409 (of the gate insulating film). As a result, it is possible to suppress unevenness in Cgd (parasitic capacitance formed between the gate electrode 411 and each of the drain electrodes 426 and 436) in the substrate.

As a result, it is possible to improve display quality of a multi-pixel driving type liquid crystal panel using the present active matrix substrate.

Besides, in the present active matrix substrate, the first drain electrode section 426 is overlapped on the edge 409x of the thin portion 409, and the second drain electrode 436 is overlapped on the edge 409y of the thin portion, so that the two drain electrode sections 426 and 436 compensate each other for a superposing area on the thin portion 409 in response to positional deviation of the drain electrode 406 (particularly, in a channel formation direction). As a result, it is possible to suppress unevenness of Cgd (parasitic capacitance formed between the gate electrode 411 and each of the drain electrodes 426 and 436) in the substrate. Note that, in case of a multi-pixel structure, the drain electrodes 406a and 406b are electrically independent on each other, so that one Cgd increases and the other Cgd decreases in case where the drain electrode deviates. As a result, the first and second pixel electrodes 401a and 401b are respectively susceptible to variations. However, a variation at the pixel electrode 401a and a variation at the pixel electrode 401b (i.e., variations in a single pixel) compensate each other (the variations are in a complementary relation), so that the display is less influenced. As a result, it is possible to improve display quality of a multi-pixel driving type liquid crystal panel using the active matrix substrate.

In this manner, (i) the arrangement in which the thin portion 409 is formed by using the gate electrode 411 (feature 1) and (ii) the arrangement in which the first drain electrode section 426 is overlapped on the edge 409x of the thin portion 409 and the second drain electrode section 436 is overlapped on the other edge 409y of the thin portion 409 (feature 2) are combined with each other so as to prevent positional deviation between the gate electrode 411 and the thin portion 409 and so as to suppress variation of a superimposing area (total) between both the drain electrodes 426 and 436 and the thin portion 409 even when each of the drain electrodes 426 and 436 deviates with respect to the thin portion 409. This makes it possible to so effectively suppress unevenness of Cgd in the substrate, so that it is possible to greatly improve display quality of a multi-pixel driving type liquid crystal panel using the present active matrix substrate.

Figure 13:
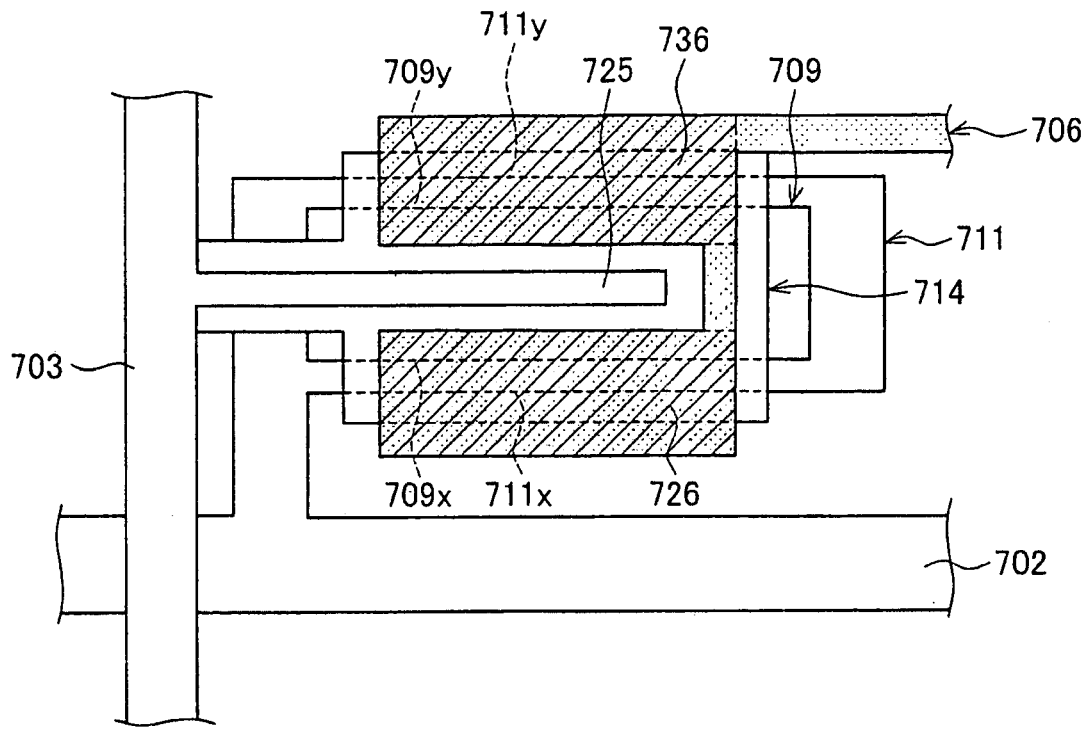
FIG. 13, showing an embodiment of the present invention, is an enlarged view of a TFT section on an active matrix substrate.

The active matrix substrate according to the present invention may be arranged as in FIG. 13. That is, a drain electrode is formed so as to surround both sides and an end of a source electrode having a rectangular shape (stretched shape).

As illustrated in FIG. 13, a drain electrode 706 is formed so as to surround (i) two sides of a source electrode 725 which are in its longitudinal direction and (ii) a side corresponding to an end of the source electrode 725. In this case, a channel region has a three-sided shape. Further, the drain electrode 706 includes first and second drain electrode sections 726 and 736 each of which has a rectangular shape so that a scanning signal line direction is its longitudinal direction, and the first and second drain electrode sections 726 and 736 are disposed in a symmetrical manner with the source electrode 725 regarded as an axis of symmetry (butterfly structure). Further, a high resistance semiconductor layer 714 is formed so as to correspond to the channel region.

A gate electrode 711 has a rectangular shape so that a scanning signal line direction (horizontal direction in FIG. 13) is its longitudinal direction, and the gate electrode 711 is connected to a scanning signal line 702. A gate insulating film (not shown) on the gate electrode 711 has a thin portion 709 which is thinner than the thickness of its peripheral portion. The gate insulating film provided on the substrate includes a plurality of gate insulating layers, and at least one of the gate insulating films is partially removed or is partially made thinner, thereby forming the thin portion 709. The thin portion 709 has a rectangular shape so that a scanning signal line direction is its longitudinal direction, and the thin portion 709 has two edges 709x and 709y which respectively correspond to two sides in the longitudinal direction and are opposite to each other. Further, edges 709x and 709y of the thin portion 709 are more internally provided than the two edges 711x and 711y of the gate electrode 711 (in a data signal line direction) which are opposite to each other so that a distance between the edge 711x and the edge 709x and a distance between the edge 711y and the edge 709y are equal to each other and the edges 709x and 709y of the thin portion 709 are respectively in lines along the edges 711x and 711y of the gate electrode 711.

Herein, the first drain electrode section 726 is formed so as to be overlapped on the edge 709x of the thin portion 709, and the second drain electrode section 736 is formed so as to be overlapped on the edge 709y of the thin portion 709.

Also in the present arrangement, the thin portion 709 is formed by using the gate electrode 711 on which the thin portion 709 is overlapped. For example, in the photolithography step for forming the thin portion 709, back exposure with the gate electrode 711 used as a mask is carried out so as to form the thin portion 709. This allows the thin portion 709 to be aligned with the gate electrode 711.

Figure 14:
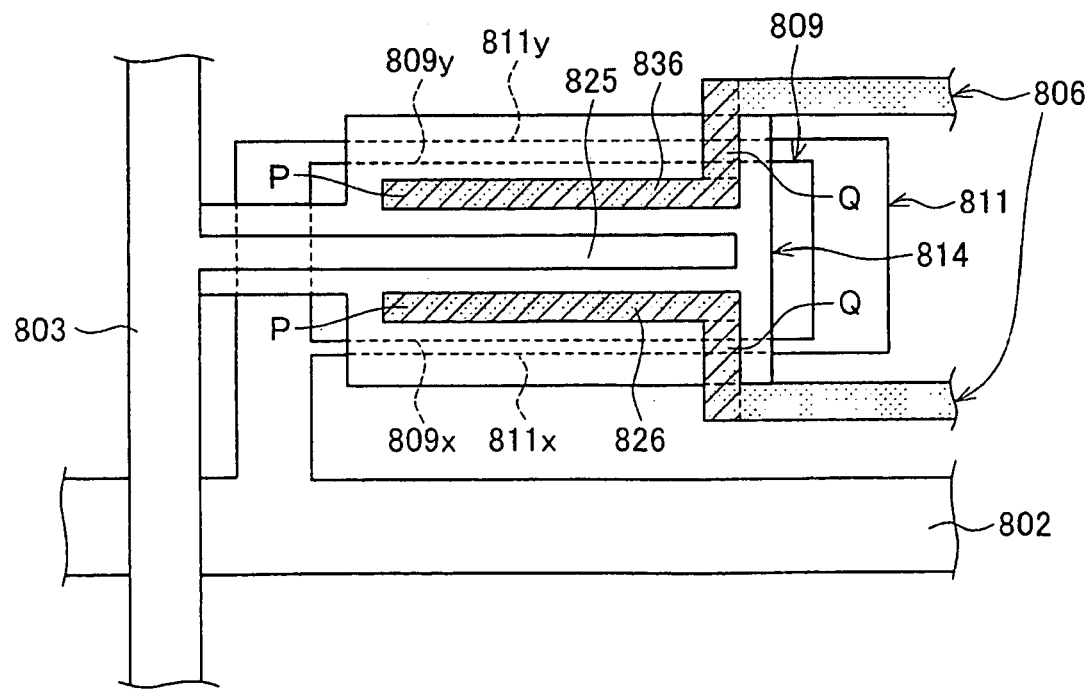
FIG. 14, showing an embodiment of the present invention, is an enlarged view of a TFT section on an active matrix substrate.

The active matrix substrate according to the present invention may be arranged as in FIG. 14. That is, two drain electrode sections are formed so as to constitute a carpenter's square shape (in a lateral L-shaped manner) (such shape that one end of a stretch portion P of an elongated rectangular is connected to a connecting portion Q of a rectangular shape which is orthogonal to the elongated rectangular and is shorter than the elongated rectangular).

As illustrated in FIG. 14, a drain electrode 806 includes drain electrode sections 826 and 836 (shaded areas in FIG. 14) each of which has the carpenter's square shape, and the first and second drain electrode sections 826 and 836 are disposed in a symmetrical manner so that its axis of symmetry corresponds to the source electrode 825 having a rectangular shape whose longitudinal direction corresponds to a scanning signal line direction (butterfly structure). Further, a high resistance semiconductor layer 814 is formed so as to correspond to a channel region.

The gate electrode 811 has a rectangular shape so that a scanning signal line direction (horizontal direction in FIG. 14) is its longitudinal direction, and the gate electrode 811 is connected to a scanning signal line 802. A gate insulating film (not shown) on the gate electrode 811 has a thin portion 809 which is thinner than the thickness of its peripheral portion. The gate insulating film provided on the substrate includes a plurality of gate insulating layers, and at least one of the gate insulating layers is partially removed or is partially made thinner, thereby forming the thin portion 809. The thin portion 809 has a rectangular shape so that a scanning signal line direction is its longitudinal direction, and the thin portion 809 has two edges 809x and 809y which respectively correspond to two sides in the longitudinal direction and are opposite to each other Further, the two edges 809x and 809y of the thin portion 809 are positioned more internally than the two edges 811x and 811y of the gate electrode 811 so that a distance between the edge 809x of the thin portion 809 and the edge 811x of the gate electrode 811 is substantially equal to a distance between the edge 809y of the thin portion 809 and the edge 811y of the gate electrode 811 and the edges 809x and 809y of the thin portion 809 are respectively in lines along the edges 811x and 811y of the gate electrode 811. Further, a stretch portion P of each drain electrode section is provided on the thin portion 809 so as to be stretched on a line along the edges 809x and 809y, and a connecting portion Q of each drain electrode extends away from the source electrode 825. Herein, the connecting portion Q of the first drain electrode section 826 is formed so as to be overlapped on the edge 809x of the thin portion 809, and the connecting portion Q of the second drain electrode section 836 is formed so as to be overlapped on the edge 809y of the thin portion 809. This arrangement causes the second drain electrode sections 826 and 836 to be less superimposed on the gate electrode 811, thereby reducing Cgd. Note that, each drain electrode section can be formed so as to have a T shape (its horizontal bar corresponds to the stretch portion P and its vertical bar corresponds to the connecting portion Q).

Also in the present arrangement, the thin portion 809 is formed by using the gate electrode 811 on which the thin portion 809 is overlapped. For example, in the photolithography step for forming the thin portion 809, back exposure with the gate electrode 811 used as a mask is carried out so as to form the thin portion 809. This allows the thin portion 809 to be aligned with the gate electrode 811.

Figure 15:
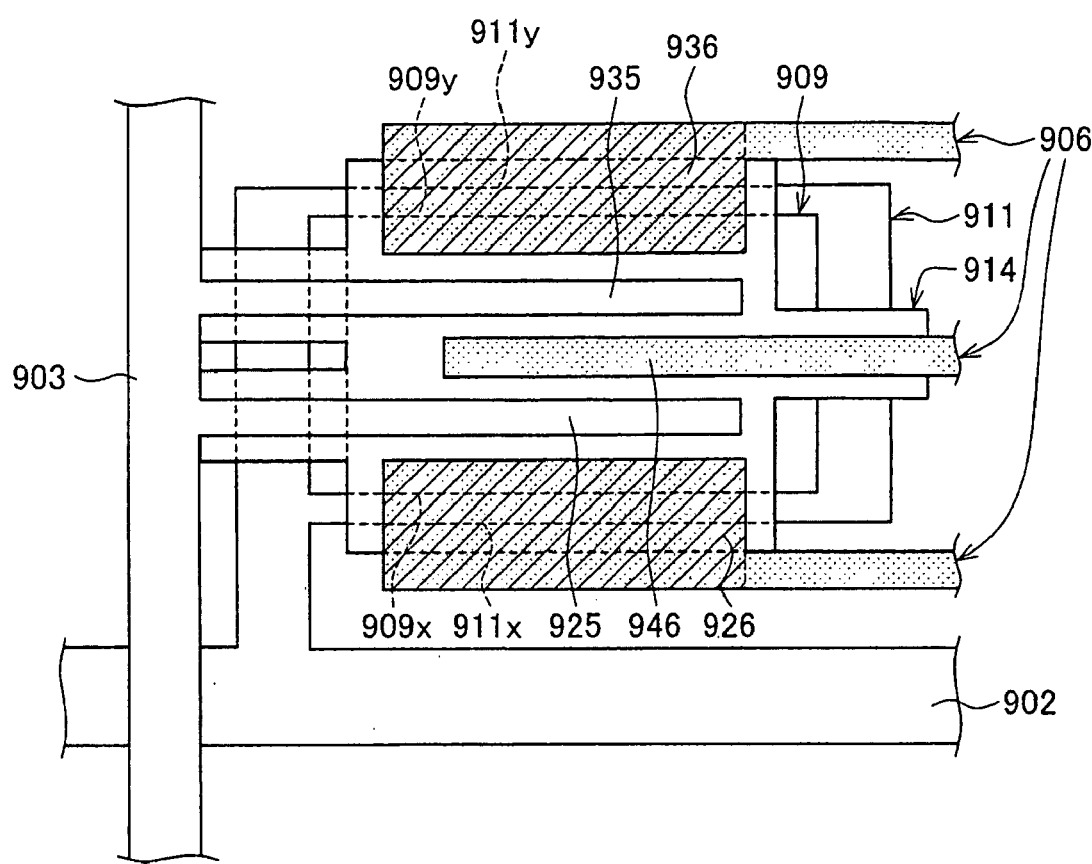
FIG. 15, showing an embodiment of the present invention, is an enlarged view of a TFT section on an active matrix substrate.

The active matrix substrate according to the present invention may be arranged as in FIG. 15. That is, three drain electrode sections and two source electrode sections are provided.

As illustrated in FIG. 15, the present arrangement is such that: first and second source electrode sections 925 and 935 are provided, and a drain electrode 906 includes first to third drain electrode sections 926, 936, and 946. Each of the first and second source electrode sections 925 and 935 and the first to third drain electrode sections 926, 936, and 946 has a rectangular shape so that a scanning signal line direction (horizontal direction in FIG. 15) is its longitudinal direction, and the first and second drain electrode sections 926 and 936 are disposed in a symmetrical manner with the third drain electrode section 946 regarded as an axis of symmetry, and the source electrode section 925 is disposed between the third drain electrode section 946 and the first drain electrode section 926, and the source electrode section 935 is disposed between the third drain electrode section 946 and the second drain electrode section 936 (butterfly structure). Note that, a high resistance semiconductor layer 914 is provided so as to correspond to each channel region.

The gate electrode 911 has a rectangular shape so that a scanning signal line direction (horizontal direction in FIG. 15) is its longitudinal direction, and the gate electrode 911 is connected to the scanning signal line 902. A gate insulating film (not shown) on the gate electrode 911 has a thin portion 909 which is thinner than the thickness of its peripheral portion. The gate insulating film provided on the substrate includes a plurality of gate insulating layers, and at least one of the gate insulating layers is partially removed or is partially made thinner, thereby forming the thin portion 909. The thin portion 909 has a rectangular shape so that a scanning signal line direction is its longitudinal direction and has two edges 909x and 909y which respectively correspond to two sides in the longitudinal direction and are opposite to each other. Further, the edges 909x and 909y of the thin portion 909 are respectively positioned more internally than the two edges 911x and 911y (opposite to each other in the data signal line direction) of the gate electrode 911 so that a distance between the one line and the edge 911x and a distance between the other line and the edge 911y are equal to each other and the edges 909x and 909y of the thin portion 909 are respectively in lines along the edges 911x and 911y of the gate electrode 911.

Herein, the first drain electrode section 926 is formed so as to be overlapped on the edge 909x of the thin portion 909, and the second drain electrode section 936 is formed so as to be overlapped on the edge 909y of the thin portion 909.

Also in the present arrangement, the thin portion 909 is formed by using the gate electrode 911 on which the thin portion 909 is overlapped. For example, in the photolithography step for forming the thin portion 909, back exposure with the gate electrode 911 used as a mask is carried out so as to form the thin portion 909. This allows the thin portion 909 to be aligned with the gate electrode 911.

Next, the liquid crystal display device according to the present embodiment is described as follows.

Figure 9:
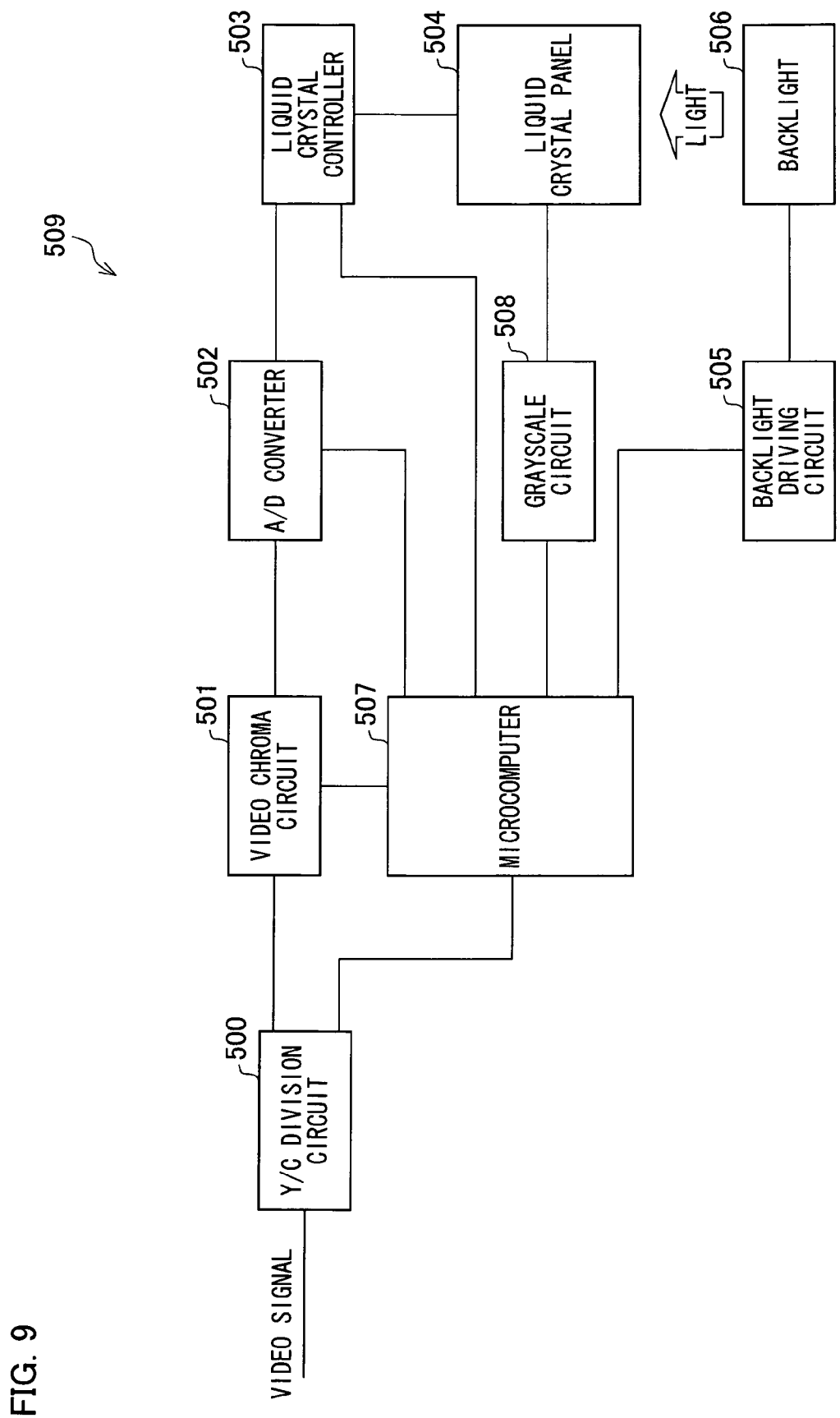
FIG. 9, showing an embodiment of the present invention, is a block diagram schematically illustrating an arrangement of a liquid crystal display device.

FIG. 9 is a block diagram schematically illustrating an arrangement of the present liquid crystal display device. As illustrated in FIG. 9, a liquid crystal display device 509 includes a Y/C division circuit 500, a video chroma circuit

501, an A/D converter 502, a liquid crystal controller 503, a liquid crystal panel 504 having the present active matrix substrate, a backlight driving circuit 505, a backlight 506, a microcomputer 507, and a grayscale circuit 508.

An image signal or a video signal indicative of an image or a video displayed in the liquid crystal display device 509 (this signal is referred to merely as "video signal") is inputted to the Y/C division circuit 500 so as to be divided into a luminosity signal and a color signal. Each of the luminosity signal and the color signal is converted by the video chroma circuit into analog RGB signals respectively corresponding to optical three primary colors. Further, the analog RGB signals are converted by the A/D converter 502 into digital RGB signals so as to be inputted to the liquid crystal controller 503.

The digital RGB signals inputted to the liquid crystal controller 503 are inputted from the liquid crystal controller 503 to the liquid crystal panel 504. The digital RGB signals are inputted from the liquid crystal controller 503 into the liquid crystal panel 504 at a predetermined timing, and grayscale voltages respectively corresponding to R, G, and B are supplied from the grayscale circuit 508 to the liquid crystal panel 504. Further, the backlight driving circuit 505 drives the backlight 506 so as to emit light to the liquid crystal panel 504. This allows the liquid crystal panel 504 to display an image or a video. Further, not only the foregoing processes but also entire operations of the liquid crystal display device 509 are controlled by the microcomputer 507.

Examples of the video signal include: a video signal based on television broadcast; a video signal indicative of an image obtained by a camera; a video signal supplied via the Internet; and similar various video signals.

Figure 10:
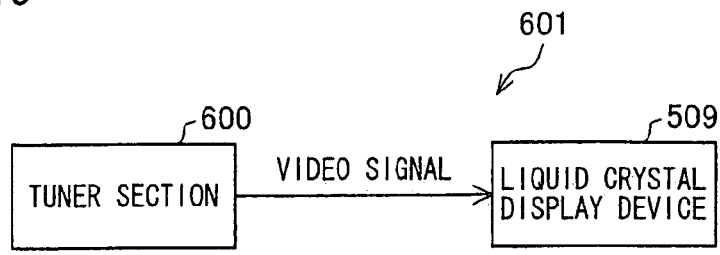
FIG. 10, showing an embodiment of the present invention, is a block diagram schematically illustrating an arrangement of a television receiver.

Further, as illustrated in FIG. 10, the liquid crystal display device 509 of the present invention is connected to a tuner section 600 for outputting a video signal in response to television broadcast, thereby allowing a video (image) to be displayed in accordance with the video signal outputted from the tuner section 600. In this case, the liquid crystal display device 509 and the tuner section 600 constitute a television receiver 601.

Figure 11:
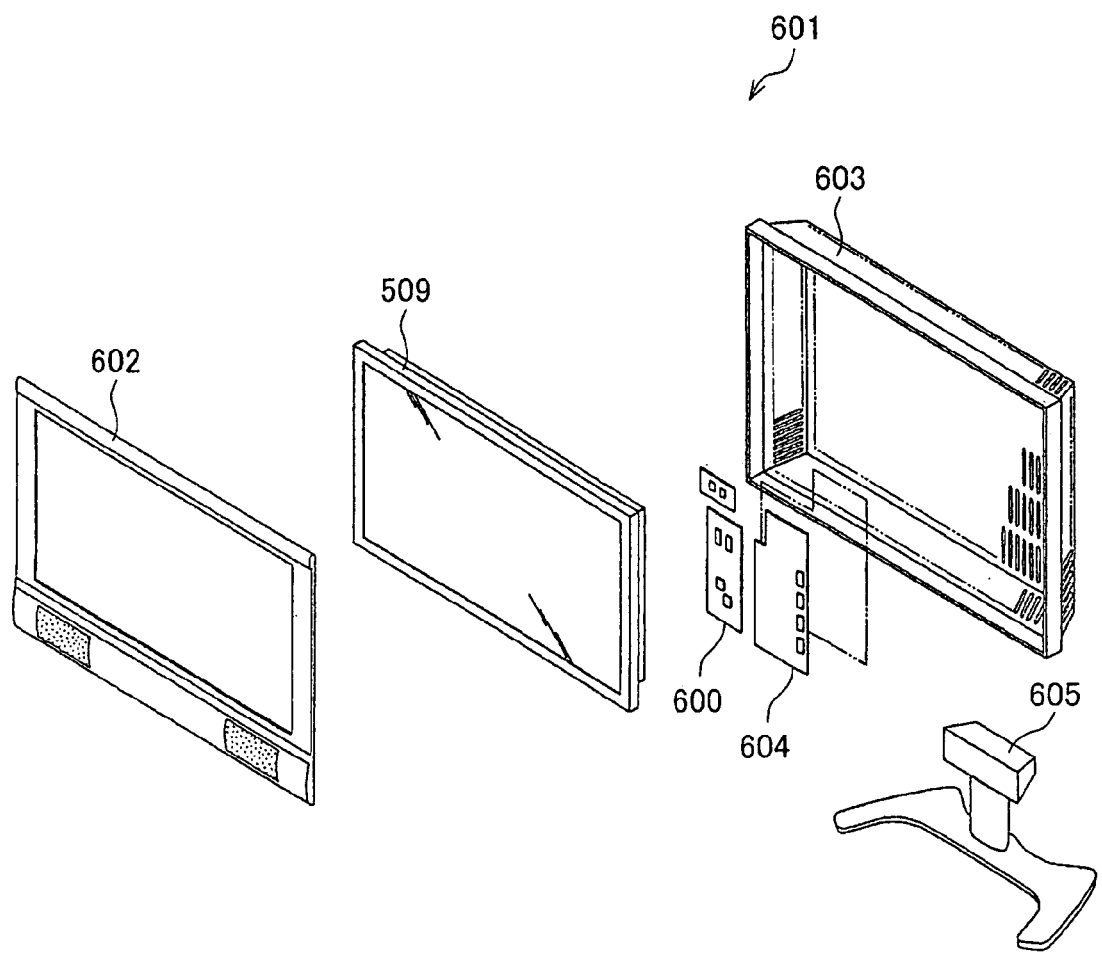
FIG. 11, showing an embodiment of the present invention, is an oblique view schematically illustrating an arrangement of a television receiver.

FIG. 11 is an oblique view schematically illustrating a state in which components of the television receiver 601 are separated from each other. As illustrated in FIG. 11, the television receiver 601 is arranged so that: the liquid crystal display device 509, the tuner section 600, a power supply circuit 604, and the like are stored between a front housing 602 and a rear housing 603 with which a stand 605 is equipped.

Embodiment 2

As described above, each of the feature 1 (arrangement in which a thin portion is formed by using a gate electrode) and the feature 2 (arrangement in which: first and second drain electrode sections opposite to each other are provided, and the first drain electrode section is overlapped on the one edge of the thin portion and the second drain electrode section is overlapped on the other edge of the thin portion) allows for such effect that unevenness of Cgd in the substrate can be suppressed. Thus, an active matrix substrate having only the feature 1 is of course included in the embodiment of the present invention.

Figure 19:
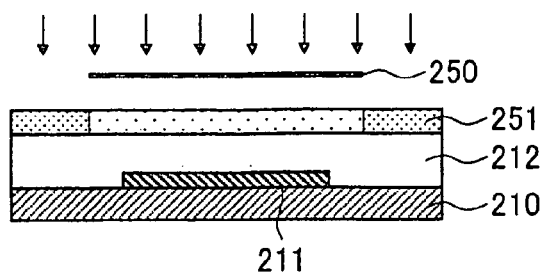
FIG. 19, showing an embodiment of the present invention, is a cross sectional view illustrating steps for manufacturing an active matrix substrate.
Figure 19:
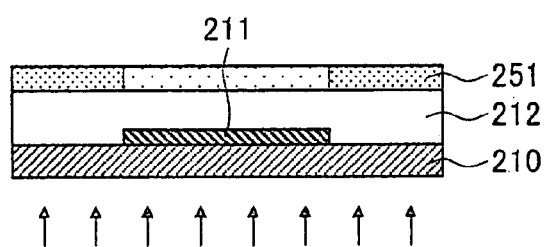
Figure 19:
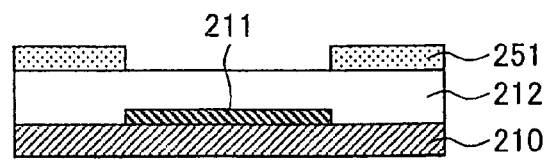
Figure 19:
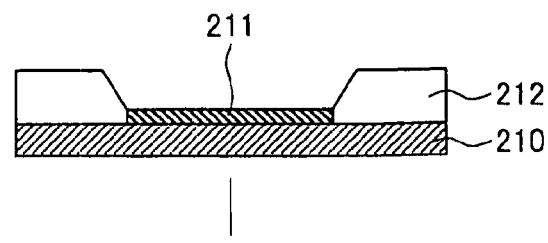
Figure 19:
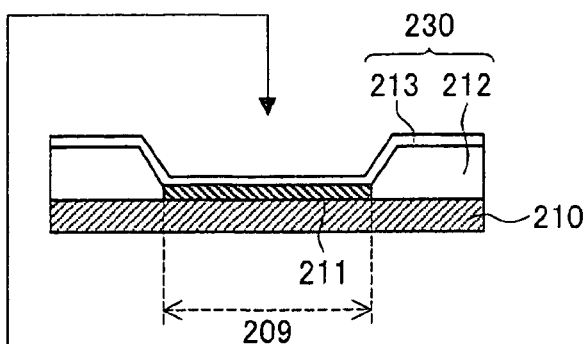

The active matrix substrate according to the present embodiment is such that the thin portion is formed by using the gate electrode, and the drain electrode and the source electrode may have any shapes. For example, it is possible to adopt a conventional arrangement illustrated in FIG. 23. With reference to FIG. 19, the following describes an example where the thin portion is formed by using the gate electrode.

First, a film made of metal such as titanium, chromium, aluminum, molybdenum, tantalum, tungsten, cupper, and the like or made of alloy thereof is formed on a transparent insulating substrate 210 by sputtering or a similar process. Further, the metal film or the alloy film is patterned by photo etching or a similar process so as to have a necessary shape, thereby forming a gate electrode 211 (gate electrode formation step).

Subsequently, an SOG material or the like is applied by spin coating so as to cover the gate electrode 211 (insulating film formation step). This allows formation of a first gate insulating layer 212 (planarizing film). Further, a negative photo resist 251 is applied to the first gate insulating layer 212 (application step), and then exposure is carried out by using a first photo mask 250 (first exposing step). As the first photo mask 250, a photo mask larger than the gate electrode 211 (photo mask whose width is larger than the gate electrode 211) is used ((a) of FIG. 19).

Further, exposure is carried out from the side of the transparent insulating substrate 210 (second exposure step). This allows exposure with the gate electrode 211 used as a mask ((b) of FIG. 19). Thereafter, development is carried out ((c) of FIG. 19). This allows the photo resist 251 to be patterned so as to be aligned with the gate electrode 211 (development patterning step). Subsequently, dry etching is carried out so as to be aligned with the gate electrode 211, thereby removing a part of the first gate insulating layer 212 (dry etching step: (d) of FIG. 19). The dry etching is carried out by using mixture gas of hydrogen tetrafluoride ($CF_4$) and oxygen ($O_2$) for example.

Subsequently, a second gate insulating layer is formed by plasma CVD (chemical vapor deposition) or the like ((e) of FIG. 19).

In this manner, back exposure is carried out with the gate electrode 211 used as a mask, and the first gate insulating layer 212 is removed so as to be aligned with the gate electrode 211, and the second gate insulating layer 213 is formed thereon (self alignment is carried out), thereby forming the thin portion 209 aligned with the gate electrode 211.

Note that, subsequent to the formation of the second gate insulating layer 213, a high resistance semiconductor layer and a low resistance semiconductor layer are formed by plasma CVD or the like. Thereafter, a data signal line, a source electrode, and a drain electrode are patterned so that each of them has an arbitrary shape (conventional shape illustrated in FIG. 23 may be adopted). Lastly, patterns of the source electrode and the drain electrode are used as masks so as to carry out dry etching (channel etching) with respect to the high resistance semiconductor layer and the low resistance semiconductor layer, thereby forming a TFT.

In this manner, Embodiment 2 allows the thin portion 209 to be aligned with the gate electrode 211, thereby avoiding unevenness in a positional relation between the gate electrode 211 and the thin portion 209 of the gate insulating film 230 in the substrate. As a result, it is possible to suppress unevenness of Cgd (parasitic capacitance formed between the gate electrode and the drain electrode) in the substrate. Thus, it is possible to improve display quality of a liquid crystal panel using the present active matrix substrate.

Embodiment 3

As described above, each of the feature L and the feature 2 allows for such effect that unevenness of Cgd in the substrate can be suppressed. Thus, an active matrix substrate having only the arrangement 2 of the present invention is of course included in the embodiment of the present invention.

Figure 6:
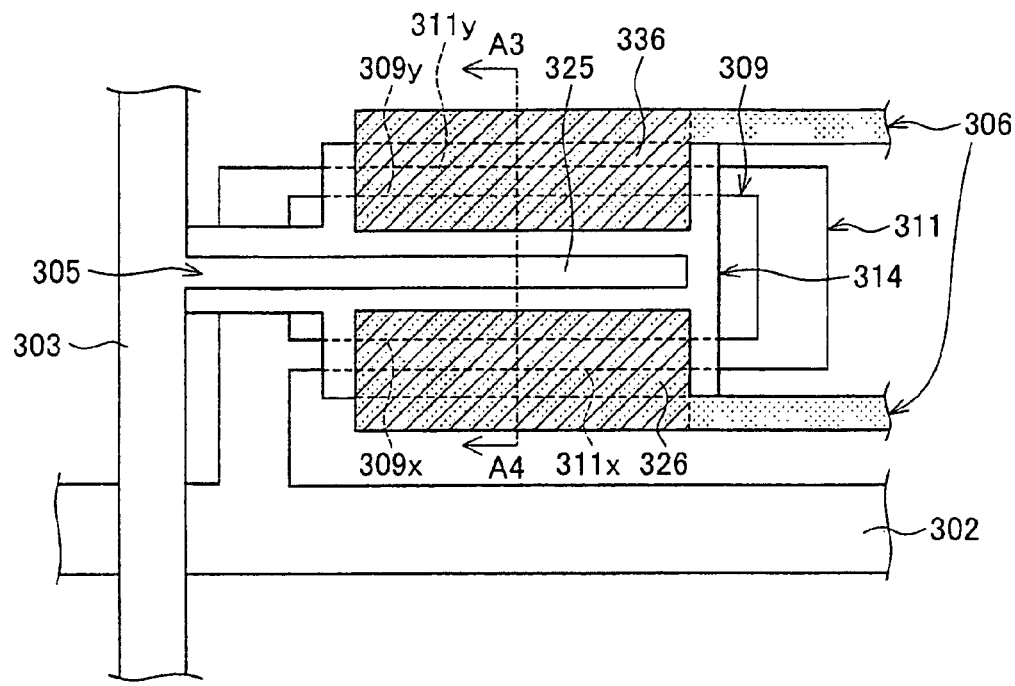
FIG. 6($a$) is an enlarged view illustrating an arrangement of the TFT of FIG. 5.
Figure 6:
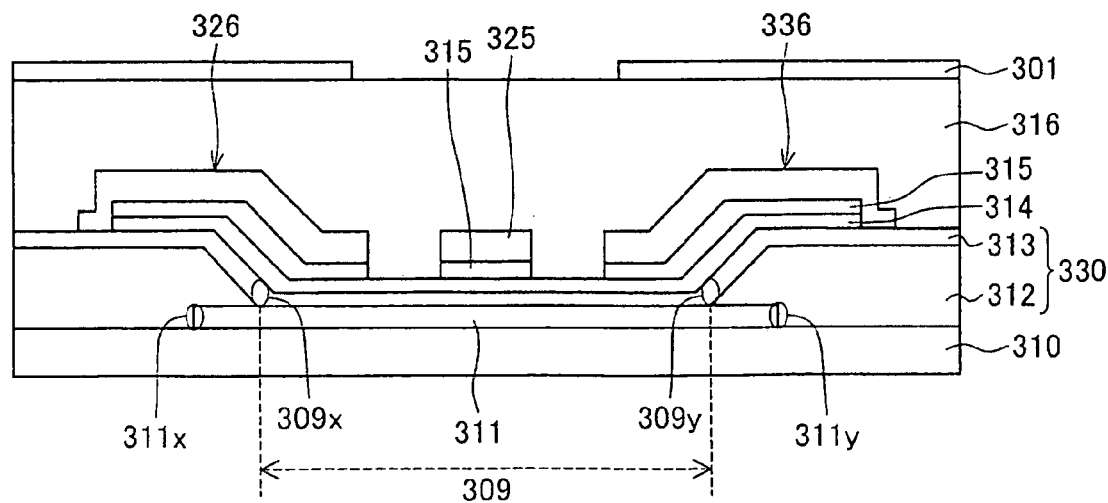

The active matrix substrate according to the present embodiment may be arranged in any manner as long as the active matrix substrate includes first and second drain electrode sections opposite to each other, wherein the first drain electrode section is overlapped on the one edge of a thin portion and the second drain electrode section is overlapped on the other edge of the thin portion (for example, shapes illustrated in FIG. 4, FIG. 6(*a*), FIG. 12 to FIG. 15). In forming the thin portion, any method (including a conventional method) may be adopted.

Figure 7:
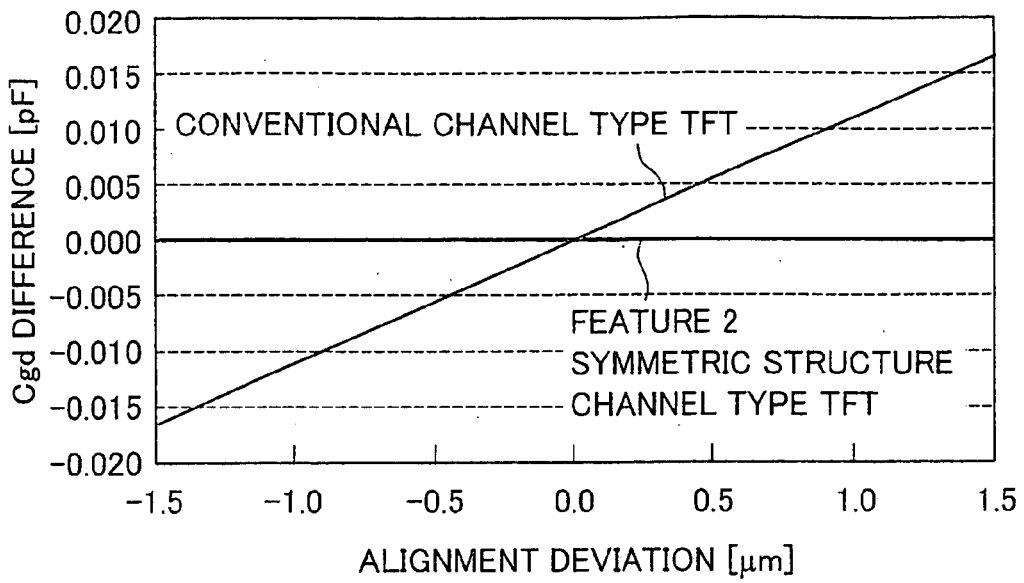
FIG. 7, showing an embodiment of the present invention, is a graph illustrating a relation between alignment deviation and Cgd.
Figure 8:
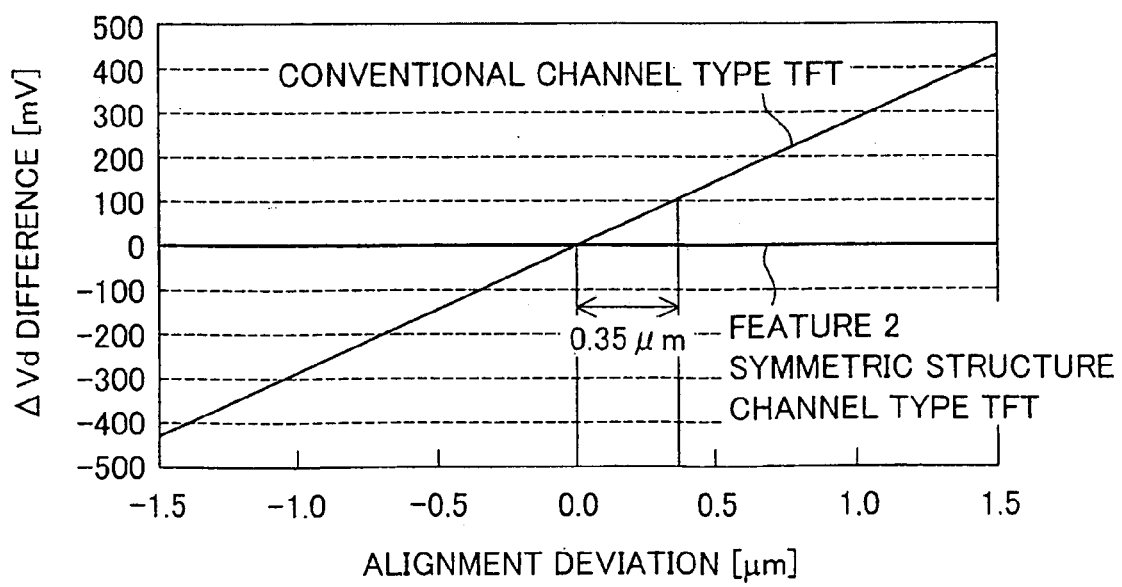
FIG. 8, showing an embodiment of the present invention, is a graph illustrating a relation between alignment deviation and variation of a (drain) potential.

The following describes a specific example of a relation between (i) alignment deviation between the drain electrode and the thin portion and (ii) a Cgd variation and a ΔVd difference. FIG. 7 is a graph illustrating a relation between (i) alignment deviation between the drain electrode and the thin portion and (ii) a Cgd difference in case where there is no alignment deviation, i.e., a Cgd difference with reference to a designed Cgd value. FIG. 8 is a graph illustrating a relation between (a) alignment deviation between the drain electrode and the thin portion and (b) a ΔVd difference. As in FIG. 8, the condition is based on such reference that there is no alignment deviation, i.e., based on a designed reference value.

In each of FIG. 7 and FIG. 8, a conventional channel type TFT (linear channel type TFT: see FIG. 23) and a symmetrical structure channel type TFT according to the feature 2 (see FIG. 4 for example) are compared with each other. Note that, in FIG. 7 and FIG. 8, each of the TFTs is such that: a channel length is 4 mm, and a channel width is 68 μm, the thickness of the gate insulating layer which forms Cgd is 400 nm (4000 Å), and a dielectric constant is 7.0. The thickness of another gate insulating layer (SOG insulating layer) positioned under the gate insulating layer is 2 μm (20000 Å), and a dielectric constant is 4.0, and an entire capacitance Cpix of the drain electrode and the pixel electrode is 1.5 pF. Each of FIG. 7 and FIG. 8 illustrates a Cgd variation in response to alignment deviation of the gate electrode and the drain electrode.

The entire capacitance Cpix of the drain electrode and the pixel electrode is a total capacitance of: a capacitance Clc with respect to a counter electrode; a capacitance Ccs with respect to a storage capacitor wiring; a capacitance Cgd with respect to a scanning signal line and a gate electrode; and a capacitance Csd with respect to a data signal line. This is expressed as Cpix=Clc+Ccs+Cgd+Csd.

Further, FIG. 8 is a graph obtained by converting the Cgd difference indicated in a vertical axis of FIG. 7 into a drain potential variation ΔVd which occurs while a scanning signal line potential changes from an ON state to an OFF state. How the scanning signal line potential varies is illustrated by the graph under such condition that a voltage is 40V and 0 μm of alignment deviation is regarded as a central value designed relative to a ΔVd variation. Note that, as illustrated in FIG. 7 and FIG. 8, the foregoing relation in each TFT is substantially in a linear manner within an alignment deviation range of about 1.5 μm.

Conventionally, a linear channel type TFT has been mainly used. As illustrated in FIG. 7, the linear channel type TFT has a great Cgd variation. Further, as illustrated in FIG. 8, the linear channel type TFT has a relatively large ΔVd difference in response to the same alignment deviation. FIG. 8 shows that a permissible alignment deviation in the ΔVd difference (i.e., an optimal counter potential difference) of 100 mV which is a reference indicative of whether the display quality is deteriorated or not.

With higher definition, a larger channel width of the TFT is required for Cpix, so that the permissible alignment deviation is small in the linear channel type TFT. This makes it more difficult to manage the manufacturing steps. That is, it is difficult to apply this arrangement to a high-definition machine such as a full-HDTV or the like.

In contrast, a slope of the ΔVd difference in the symmetrical structure channel type TFT is improved as illustrated in FIG. 7 and FIG. 8. A shape constituted of the drain electrode and the first gate insulating layer (SOG insulating film) has a symmetric structure (butterfly structure). Thus, even in case where a relative alignment position of the gate electrode, the drain electrode, and the SOG insulating film is arranged in any manner, these members compensate each other for increase/decrease of Cgd, so that a total of Cgd hardly varies (FIG. 7).

Figure 21:
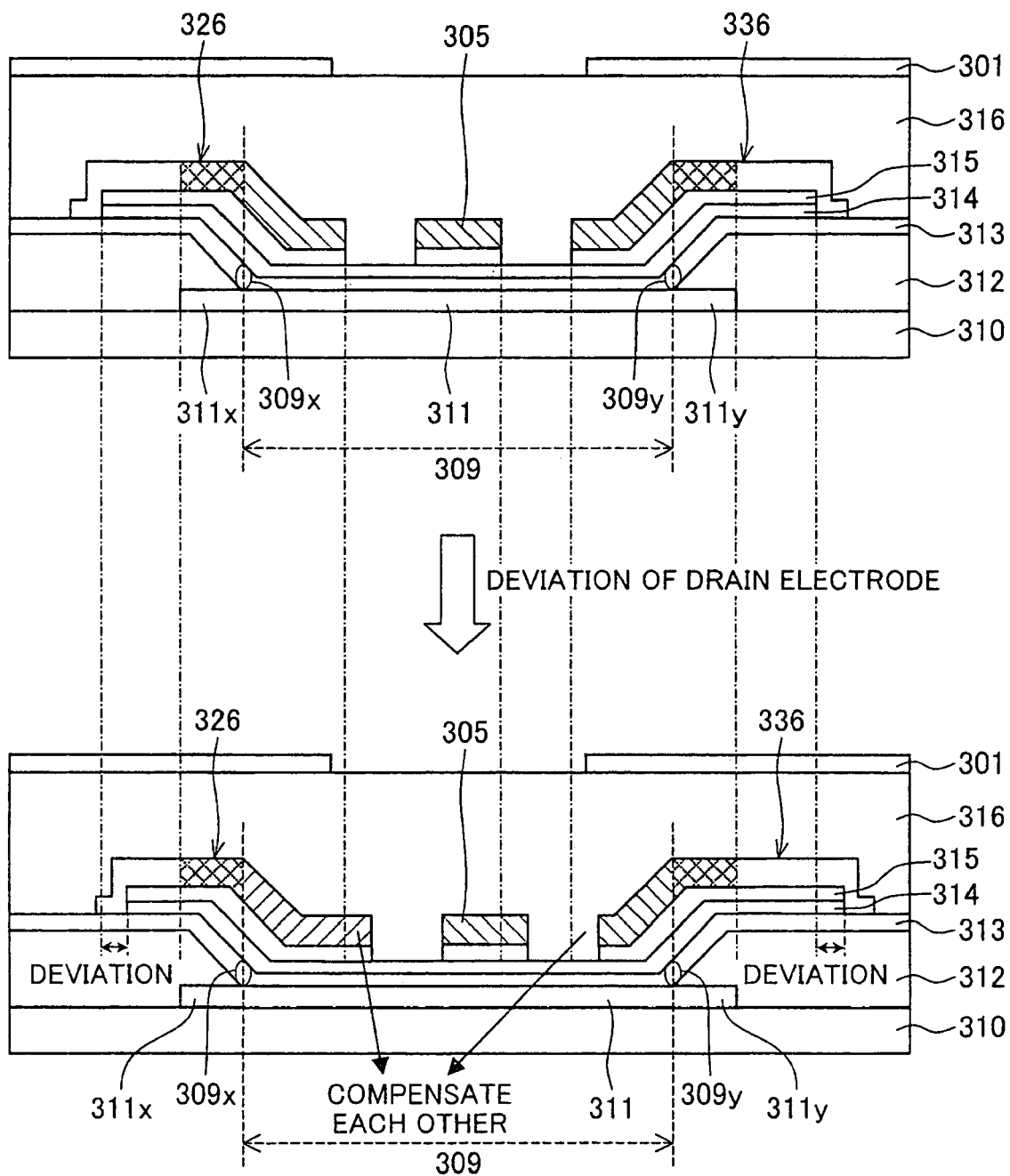
FIG. 21 is a cross sectional view illustrating effect (against drain deviation) of the present embodiment.
Figure 22:
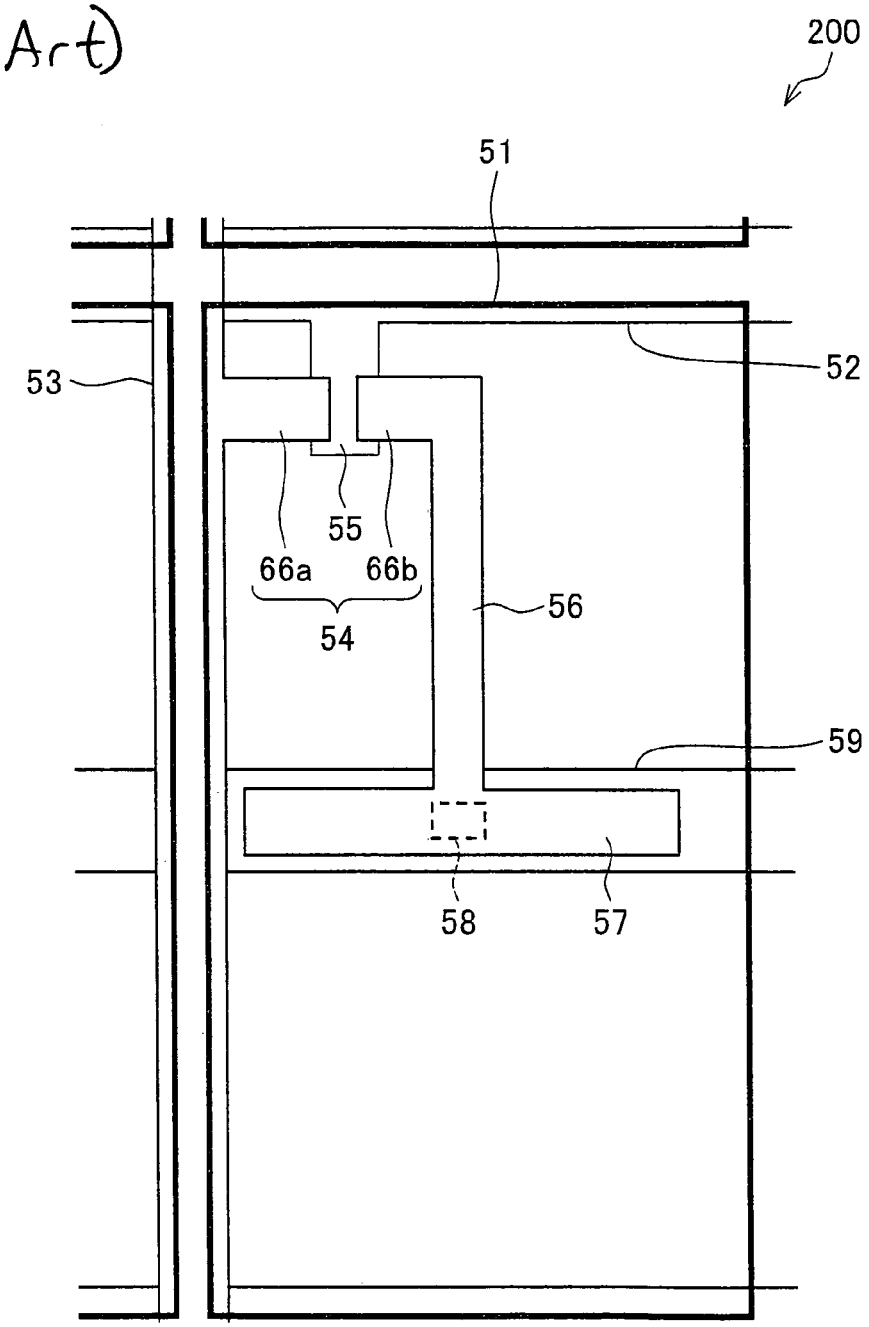
FIG. 22 is a plan view illustrating a pixel on a conventional active matrix substrate.
Figure 23:
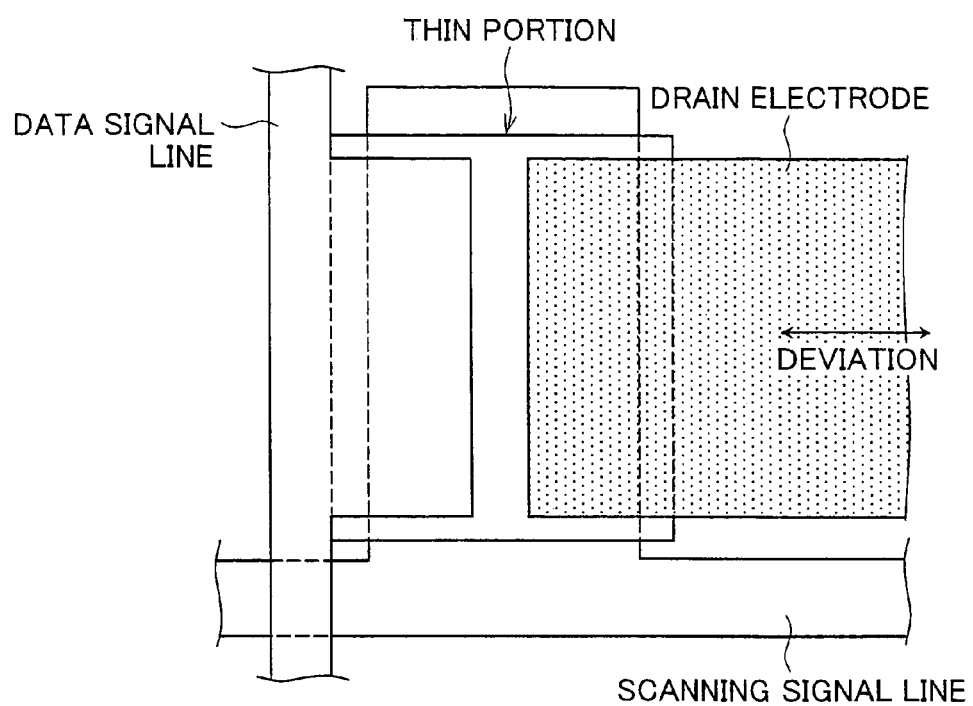
FIG. 23 is a plan view illustrating an arrangement of a TFT on a conventional active matrix substrate.

In this manner, Embodiment 3 allows the two drain electrode sections to compensate each other for a superposing area between each drain electrode section and the thin portion in response to positional deviation of the drain electrode (particularly, deviation in a channel formation direction) (see also FIG. 20 and FIG. 21). This makes it possible to suppress unevenness of Cgd in the substrate. As a result, it is possible to improve display quality of a liquid crystal panel using the present active matrix substrate.

The following describes how unevenness between pixels in the parasitic capacitance Cgd formed between the drain electrode and the gate electrode influences display (luminosity).

The unevenness in the parasitic capacitance Cgd occurs as unevenness in a drain potential variation ΔVd which occurs while a potential of the scanning signal line (gate electrode) changes from an ON state to an OFF state.

The liquid crystal display device is generally driven by an alternating current. When a counter potential is Vcom and a drain potential is Vd, there are two states, i.e., Vcom>Vd and Vcom<Vd. However, ΔVd is a variation caused by potential variation of the scanning signal line (gate electrode), so that the potential variation is only in a negative direction.

When a potential applied to the liquid crystal layer is Vlc, there is such relation that Vlc=Vd−Vcom. That is, it is necessary to equalize absolute values of Vlc in the two states, i.e., Vcom<Vd and Vcom>Vd, so as to equalize brightness in the one state and brightness in the other state so that display deterioration such as flicker or the like can be suppressed. In order to suppress such display deterioration, it is possible to adopt such method that a potential of Vcom is adjusted (counter adjustment).

However, it is difficult to equalize the absolute values of Vlc (=Vd−Vcom) in all the display regions of the liquid crystal display device for the following reason. That is, exposure is carried out to form a TFT, and in case of manufacturing an active matrix substrate used for a large liquid crystal panel, it is generally impossible to carry out exposure with respect to the entire panel at once in carrying out exposure of photoresist for patterning of a single layer, so that it is necessary to carry out plural exposure processes (so as to correspond to plural regions). In this case, it is difficult to equally finish all the TFTs obtained by the plural exposure processes, so that a positional relation (alignment) of layers constituting the active matrix substrate varies depending on regions respectively corresponding to the exposure processes. That is, alignment deviation of the drain electrode and the gate electrode occurs between the exposure processes.

That is, a capacitance such as Cgd formed between the drain electrode and the gate electrode varies between the exposed regions, so that an optimal counter potential Vcom for equalizing positive and negative absolute values of Vlc varies between the pixel regions respectively corresponding to the exposed regions. However, in view of a structure of the liquid crystal panel, the counter electrode to which the counter potential Vcom is applied is a single common electrode, so that only a common potential can be set as Vcom. This makes it difficult to respectively adjust Vcom potentials in the pixel regions respectively corresponding to the exposure processes.

Thus, it is difficult to equalize the absolute values of Vlc in the entire display regions. Accordingly, there is a certain difference between the pixel regions respectively corresponding to the exposed regions in terms of positive/negative absolute value. As a result, a difference (optimal counter deviation) between an optimal counter potential of a pixel region corresponding to each exposed region and a common counter potential having been set causes the pixel regions to be different in terms of luminosity. Thus, in case where the pixel regions are greatly different from each other in terms of luminosity, this causes display deterioration such as display unevenness, a bright or dark strip, luminosity inclination in the left and right sides of the liquid crystal panel.

Figure 16:
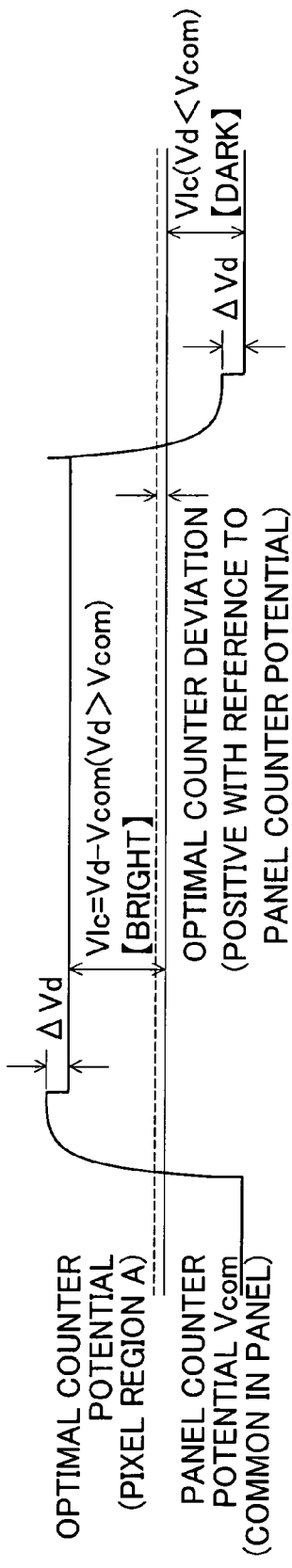
FIG. 16 is a graph indicative of a waveform of a drain potential in a pixel region and a waveform of a drain potential in another pixel region.
Figure 16:
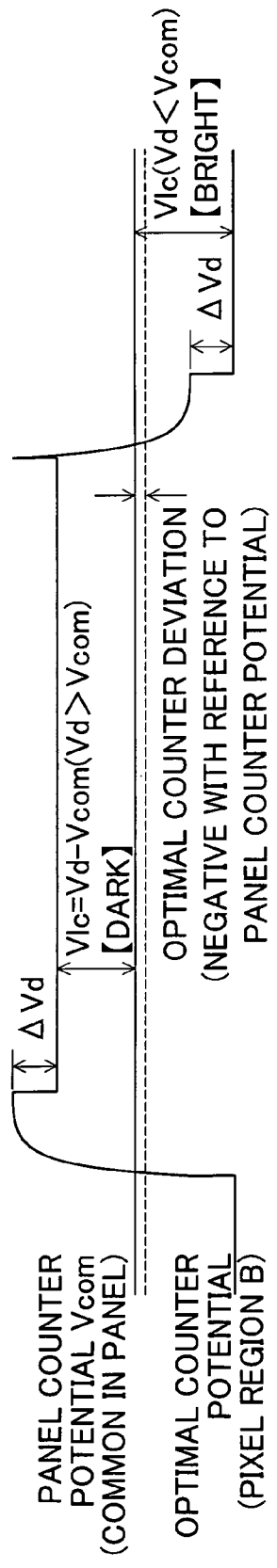

FIG. 16 is a graph illustrating waveforms of drain potentials in the pixel regions respectively corresponding to the exposed regions different from each other. As illustrated in FIG. 16, a pixel region A and a pixel region B respectively corresponding to the exposed regions different from each other have optimal counter potentials different from each other. Thus, the panel counter potential Vcom is a common potential, so that it is impossible to equalize the absolute values of Vlc. As a result, the pixel regions are different from each other in terms of luminosity. Note that, FIG. 16 illustrates brightness and darkness which are states in adopting a normally black mode.

Figure 17:
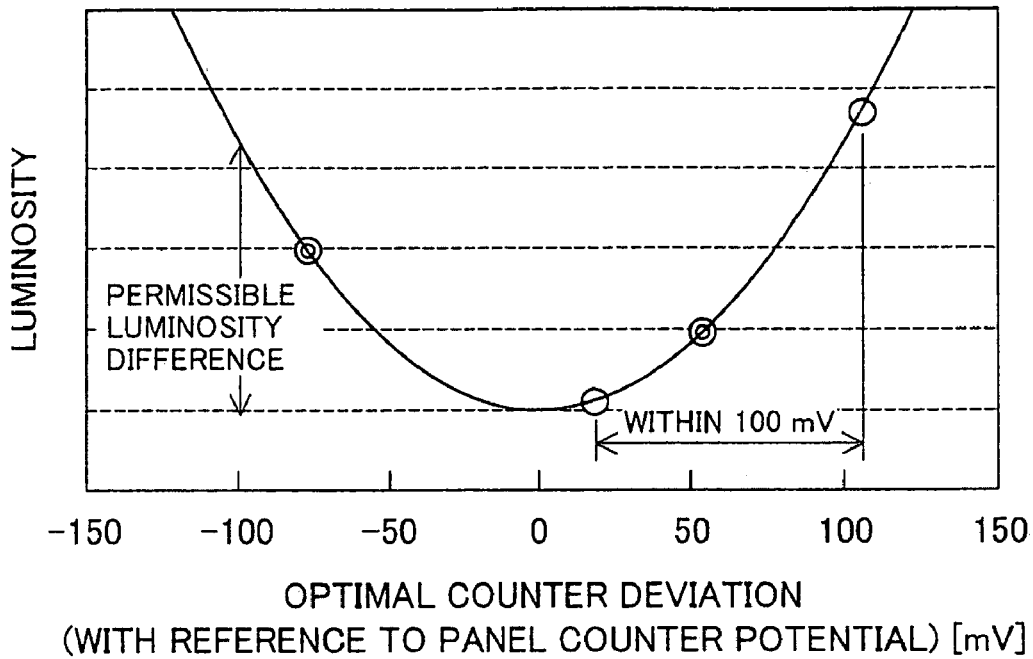
FIG. 17 is a graph illustrating how a luminosity varies in response to optimal counter deviation.

Next, the following describes how the luminosity varies in response to the optimal counter deviation. FIG. 17 is a graph illustrating how the luminosity varies in response to the optimal counter deviation. A plurality of pixel regions respectively corresponding to the exposed regions are different from each other in terms of an optimal counter potential. However, as illustrated in FIG. 17, a relation of the luminosity with respect to the optimal counter deviation is indicated by substantially a quadric. This is based on the following reason: Compared with the case where a positive optimal counter (potential) deviation and a negative optimal counter (potential) deviation are equal to each other, brightness at a time range where Vlc is positive and brightness at a time range where Vlc is negative do not vary, and brightness/darkness in case where Vlc is positive and brightness/darkness in case where Vlc is negative merely change from each other, so that luminosities are the same as entirely viewed.

The optimal counter potential of each pixel region depends on a resultant TFT. That is, the panel counter potential to be set is determined in accordance with a distribution of optimal counter potentials of the pixel regions, that is, in accordance with a distribution of resultants each of which has alignment deviation caused by the entire exposure processes in the entire screen. For example, a size of a panel which can be manufactured only by two exposure processes (exposure by two shots) allows the brightness of one display region and brightness of the other display region to be equalized if an average of optimal counter potentials of both the exposed regions is set as a set counter potential of the panel. However, if a larger panel requires a large number of exposure processes in patterning a single layer, it is necessary to more strictly manage a center of the alignment deviation distribution so as to suppress (i) unevenness of the set counter potentials of the panels and (ii) the luminosity inclination in the left and right sides of the panel. However, this raises a problem in case where optimal counter potentials of pixel regions adjacent to each other disproportionately have the same polarity with respect to the set counter potential of the panel and the optimal counter deviation results in the luminosity difference. Thus, it is necessary to specify an alignment deviation range between exposed regions adjacent to each other in managing the exposure condition.

Particularly, in case where a difference between optimal counter potentials of pixel regions respectively corresponding to the exposed regions adjacent to each other is larger than about 100 mV, display is significantly deteriorated. It is necessary to adopt measures for suppressing influence that the manufactured resultant exerts to the display. Further, with a larger size, higher definition, and higher frequency of a liquid crystal panel, an extremely great load is exerted to the entire liquid crystal panel. Particularly, a larger TFT causes a higher cross capacitance between the scanning signal line and the data signal line. This significantly delays signals of these signal lines. Also measures for decreasing the load is required.

In FIG. 17, optimal counter deviations of pixel regions respectively corresponding to the exposed regions are indicated by ○ and ⊙ respectively. A combination of ○ and a combination of ⊙ are combinations each of which is indicative of (i) a luminosity of a pixel region corresponding to the exposed region and (ii) an optimal counter deviation. As indicated by ⊙, in case where optimal counter deviations of pixel regions adjacent to each other result in different polarities (optimal counter potential deviations result in polarities different from each other with respect to the set panel counter potential), even an optimal counter potential difference greater than 100 mV between the pixel regions is within a permissible luminosity difference.

On the other hand, as indicated by ○, in case where optimal counter deviations of pixel regions adjacent to each other result in the same polarity (optimal counter potential deviations result in the same polarity with respect to the set panel counter potential), an optimal counter potential difference greater than 100 mV between the pixel regions can not be within a permissible luminosity difference. In other words, an optimal counter potential difference less than 100 mV is within the permissible luminosity difference.

Figure 18:
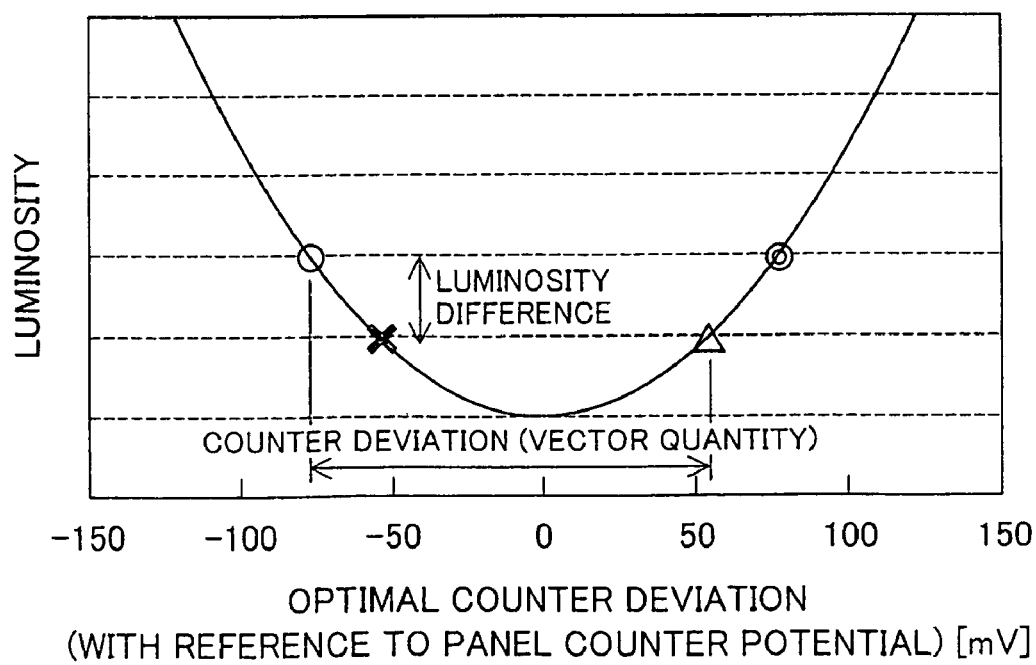
FIG. 18 is a graph illustrating how a luminosity varies in response to optimal counter deviation (in case of a multi-pixel arrangement).

Next, the following describes how a luminosity in the multi pixel structure (see FIG. 12) varies in response to the optimal counter deviation. FIG. 18 is a graph illustrating how the luminosity varies in response to the optimal counter deviation. In FIG. 18, ○ and ⊙ show the same pixel region, and Δ and x show the same pixel region corresponding to an exposed region adjacent to the foregoing pixel region. Further, a blank and a daubed sign respectively indicate sub pixels constituting a single pixel.

As illustrated in FIG. 18, when the multi pixel technique is adopted, two optimal counter deviation regions respectively corresponding to the two sub pixels are included in a pixel region corresponding to the same exposed region. Further, a TFT on the side of the one sub pixel has higher Cgd and greater ΔVd, and a TFT on the side of the other sub pixel has lower Cgd and smaller ΔVd.

Thus, variations of ΔVd in both the TFTs are equal to each other though variation directions thereof are opposite to each other. Thus, the optimal counter potentials of the pixel regions corresponding to the same exposed region are not varied by alignment deviation. This is applicable also to the exposure processes carried out with respect to all the layers. That is, in case where line widths of gate electrodes and drain electrodes in the pixel region are finished in the same manner, the optimal counter potential and the panel counter potential in the pixel region are identical to each other.

Thus, in case of a multi-pixel type, a luminosity is determined by an alignment deviation and is not relative to an alignment deviation direction. Therefore, in case of a normal pixel electrode which is not the multi-pixel structure, it is necessary to specify an alignment deviation range between exposed regions adjacent to each other in managing the exposure condition. However, in case of the multi-pixel type, only the permissible range of alignment deviation has to be managed.

Each of the foregoing embodiments exemplified a liquid crystal display device, but the present invention is not limited to this. For example, the present invention is applicable also to other display device, such as an organic EL display device, which includes: a color filter substrate; and the active matrix substrate of the present invention which is disposed so as to be opposite to the color filter substrate, wherein an organic EL layer is provided between the substrates. Further, the present invention is applicable also to a display device other than the liquid crystal display device and the organic EL display device as long as the display device includes an active matrix substrate. Further, the display device and the television receiver explained in the present embodiment are applicable also to the active matrix substrate of other embodiment.

The active matrix substrate of the present invention can be expressed also as follows: a plurality of scanning wirings and a plurality of signal wirings are formed on a transparent insulating substrate, and an SOG film is laminated between the scanning wirings and the signal wirings, and a TFT is formed in the vicinity of a junction of each of the scanning wirings and each of the signal wirings, wherein the TFT is formed on the scanning line or on a gate electrode electrically connected to the scanning line, and the SOG film is partially removed from the scanning line or the gate electrode electrically connected to the scanning line, and a gate insulating layer, a semiconductor layer, and a semiconductor connection layer are formed so as to include the SOG film, and a source electrode electrically connected to the signal wiring and a drain electrode electrically connected to a pixel electrode are laminated on the semiconductor connection layer, and a periphery of the SOG film on the scanning line or the gate electrode and a cross point of the drain electrode are positioned as a pair.

Further, it may be so arranged that a width of the SOG film is narrower than a width of the scanning signal or the gate electrode formed on the TFT. Further, it may be so arranged that the SOG film is formed after forming the gate insulating layer.

Further, the liquid crystal display device of the present invention is arranged so that liquid crystal is provided between the active matrix substrate and the insulating substrate both of which are positioned as a pair. Note that, the display device of the present invention may be arranged so that self-luminous material is provided between the active matrix substrate and the insulating substrate both of which are positioned as a pair.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The active matrix substrate of the present invention includes an active element such as a TFT and can be favorably used for an active matrix type display device such as a liquid crystal display device, an EL display device, and the like.

The invention claimed is:

1. An active matrix substrate, comprising
a plurality of transistors, wherein a gate insulating film which covers a gate electrode of each of the transistors has a thin portion, having a reduced film thickness, which is provided on a part overlapped on the gate electrode, and the transistor has (i) a source electrode and (ii) a first drain electrode and a second drain electrode which are respectively provided on both sides of the source electrode, and the thin portion has a shape whose two edges are opposite to each other and the first drain electrode is overlapped on the one edge and the second drain electrode is overlapped on the other edge.

2. The active matrix substrate as set forth in claim 1, wherein the first drain electrode and the second drain electrode are positioned in an axisymmetrical manner.

3. The active matrix substrate as set forth in claim 1, wherein the source electrode extends on an axis of symmetry between the first drain electrode and the second drain electrode.

4. The active matrix substrate as set forth in claim 1, wherein the gate electrode has a shape whose two edges are opposite to each other and the edges of the thin portion are respectively positioned on the edges of the gate electrode.

5. The active matrix substrate as set forth in claim 4, wherein the gate electrode has a rectangular shape, and two sides in a longitudinal direction respectively correspond to the two edges of the gate electrode.

6. The active matrix substrate as set forth in claim 1, wherein the gate electrode has a shape whose two edges are opposite to each other, and the edges of the thin portion are respectively positioned on lines which are more internally positioned away from and along the edges of the gate electrode substantially at equal distances.

7. The active matrix substrate as set forth in claim 1, wherein the source electrode has a first source electrode section and a second source electrode section which are opposite to each other, and a third drain electrode section is provided between the first source electrode section and the second source electrode section.

8. The active matrix substrate as set forth in claim 1, wherein the gate insulating film has a plurality of gate insulating layers, and at least one of the gate insulating layers is made thin in the thin portion.

9. The active matrix substrate as set forth in claim 1, wherein the gate insulating film has a plurality of gate insulating layers, and one or more of the gate insulating layers correspond to the thin portion, and a larger number of the gate insulating layers correspond to other portion.

10. The active matrix substrate as set forth in claim 9, wherein a gate insulating layer containing an organic matter.

11. The active matrix substrate as set forth in claim 9, wherein a lowest layer of the gate insulating layers is a planarizing film and corresponds to said other portion.

12. The active matrix substrate as set forth in claim 11, wherein the planarizing film is made of Spin On Glass (SOG) material.

13. The active matrix substrate as set forth in claim 11, wherein the planarizing film has a portion which is in contact with a face of the substrate and whose thickness is larger than a thickness of the gate electrode formed on the face of the substrate.

14. The active matrix substrate as set forth in claim 1, wherein a vicinity of each of the edges in the gate insulating film has a forward tapered shape.

15. The active matrix substrate as set forth in claim 1, wherein the thin portion has a rectangular shape, and two sides in a longitudinal direction respectively correspond to the edges of the thin portion.

16. The active matrix substrate as set forth in claim 1, wherein each of the first drain electrode section and the second drain electrode section extends in a direction of the edges of the thin portion.

17. The active matrix substrate as set forth in claim 1, wherein each of the first drain electrode section and the second electrode section has (I) a stretch portion which is stretched in a direction of the edges of the thin portion and (II) a connecting portion which extends from the stretch portion in a direction away from the source electrode, and the stretch portion is positioned above the thin portion and the connecting portion is overlapped on the edge of the thin portion, and a width of the connecting portion in the direction of the edges is smaller than a width of the stretch portion in the direction of the edges.

18. A display device, comprising the active matrix substrate as set forth in claim 1.

19. An active matrix substrate, comprising:
a first and a second transistor that share a source electrode and a gate electrode and correspond to each of pixel regions, wherein a first drain electrode section of the first transistor and a second drain electrode section of the second transistor are opposite to each other, and the source electrode is provided between the first electrode section and the second electrode section, and a gate insulating film which covers each gate electrode has a thin portion, having a reduced film thickness, which is provided on a part overlapped on the gate electrode, and the thin portion has a shape whose two edges are opposite to each other and the first drain electrode is overlapped on the one edge and the second drain electrode is overlapped on the other edge.

20. A display device, comprising the active matrix substrate as set forth in claim 19.

* * * * *